United States Patent
Tamenori

(10) Patent No.: US 8,865,567 B2
(45) Date of Patent: Oct. 21, 2014

(54) METHOD OF MANUFACTURING SEMICONDUCTOR DEVICE

(75) Inventor: Akira Tamenori, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/817,112

(22) PCT Filed: Sep. 20, 2011

(86) PCT No.: PCT/JP2011/071408
§ 371 (c)(1),
(2), (4) Date: Mar. 26, 2013

(87) PCT Pub. No.: WO2012/039403
PCT Pub. Date: Mar. 29, 2012

(65) Prior Publication Data
US 2013/0203238 A1 Aug. 8, 2013

(30) Foreign Application Priority Data
Sep. 22, 2010 (JP) .................. 2010-211487

(51) Int. Cl.
*H01L 21/00* (2006.01)
*H01L 29/66* (2006.01)
*H01L 21/782* (2006.01)
*H01L 21/67* (2006.01)

(52) U.S. Cl.
CPC ......... *H01L 21/782* (2013.01); *H01L 21/67092* (2013.01); *H01L 29/66348* (2013.01)
USPC .......................................... 438/462; 438/460

(58) Field of Classification Search
CPC .............................. H01L 24/94; H01L 24/98
USPC ..................................... 438/460, 462
See application file for complete search history.

(56) References Cited

U.S. PATENT DOCUMENTS

2007/0184660 A1* 8/2007 Fujimura .................. 438/691

FOREIGN PATENT DOCUMENTS

| JP | 05-315304 A | 11/1993 |
| JP | 2005-244165 A | 9/2005 |
| JP | 2006-032390 A | 2/2006 |
| JP | 2007-036129 A | 2/2007 |
| JP | 2007-287780 A | 11/2007 |

* cited by examiner

*Primary Examiner* — Bradley K Smith
(74) *Attorney, Agent, or Firm* — Rabin & Berdo, P.C.

(57) ABSTRACT

Ineffective chips are formed in the circumference of a semiconductor wafer and effective chips are formed in a region surrounded by the ineffective chips. Dicing lines partition the effective chips and the ineffective chips. Polyimide is formed on an outer circumferential portion of the semiconductor wafer with a predetermined width from an outer circumferential end of the semiconductor wafer such that the polyimide continuously covers the ineffective chips from the outer circumferential end of the semiconductor wafer to the inside and continuously covers a portion which is a predetermined distance away from the outer circumferential end of the semiconductor wafer to the effective chip in the dicing line interposed between the ineffective chips. A metal film is formed on the front electrode formed on the effective chips by plating. The semiconductor wafer is cut into semiconductor chips along the dicing lines by a blade.

19 Claims, 17 Drawing Sheets

US 8,865,567 B2

METHOD OF MANUFACTURING SEMICONDUCTOR DEVICE

TECHNICAL FIELD

The present invention relates to a method of manufacturing a semiconductor device, and more particularly, to a semiconductor device manufacturing method of manufacturing a semiconductor wafer (hereinafter, simply referred to as a wafer) using dicing with a blade.

BACKGROUND ART

In recent years, in power semiconductor devices, such as an IGBT (insulated gate bipolar transistor), a MOSFET (MOS field effect transistor), and a diode which are provided in inverters, the thickness of a silicon substrate for forming the power semiconductor device has been reduced in order to improve the electrical characteristics of the power semiconductor device.

FIG. 13 is a diagram illustrating the cross-sectional structure of a main portion of an FS (Field Stop)-IGBT. In FIG. 13, the FS-IGBT includes a p well layer 52 that is provided (formed) in a surface layer of an n silicon substrate 51d (when a wafer 51 is cut into chips) with a thickness of about 150 μm and a trench 53 that passes through the p well layer 52.

In addition, the FS-IGBT includes an n emitter layer 54 that is provided in a surface layer of the p well layer 52 so as to come into contact with the trench 53. A gate oxide film 55 is provided on the inner wall of the trench 53 and a gate electrode 56 is provided in the trench 53 through the gate oxide film 55.

An interlayer insulating film 57 is provided on the gate electrode 56 and an emitter electrode 58 is provided on the interlayer insulating film 57 so as to be electrically connected to the n emitter layer 54. An n-FS layer 60 and a p collector layer 61 are provided on the rear surface of the n silicon substrate 51d and a collector electrode 62 is provided on the p collector layer 61 so as to be electrically connected thereto. Next, a process of manufacturing the FS-IGBT will be described.

(1) A surface structure including, for example, the p well layer 52, the n emitter layer 54, the gate electrode 56, and an aluminum electrode 58a (which is a front electrode and is a portion of the emitter electrode 58) is formed on the front surface of a thick wafer. The interlayer insulating film 57 is formed on the gate electrode 56 and the aluminum electrode 58a is formed on the interlayer insulating film 57.

(2) A protective tape is attached to the front surface of the thick wafer and the rear surface of the thick wafer is ground. Then, the protective tape peels off and wet etching is performed on a grinding surface to remove a fractured layer. In this way, a thin wafer 51 with a thickness of about 150 μm is obtained.

(3) Phosphorous (P) and boron (B) ions are implanted into the rear surface and annealing is performed to form an n-FS layer 60 and a p collector layer 61.

(4) Polyimide 76 is applied onto the entire upper surface of the wafer 51 and the polyimide 76 on the emitter electrode 58 of an effective chip 71 is removed (see (a) of FIG. 14). FIG. 14 is a diagram illustrating a wafer according to the related art. In FIG. 14, (a) is a plan view illustrating a portion 77 of the wafer according to the related art in which only polyimide on an emitter electrode of an effective chip is removed, (b) is a cross-sectional view illustrating a main portion taken along the line X1-X1 of (a), and (c) is a cross-sectional view illustrating a main portion taken along the line X2-X2 of (a).

In (b) and (c) of FIG. 14, reference numeral 74 indicates the center line of a dicing line 73 and reference numeral 57a indicates an insulating film that covers the breakdown voltage structure of an IGBT and the dicing line 73. In addition, in (a) and (c) of FIG. 14, the leading end of a lead line A is the end of the exposed emitter electrode and indicates the emitter-electrode-side end of the polyimide 76 and the leading end of a lead line B is the end of the dicing line 73 and indicates the end of the polyimide 76.

In the polyimide 76 which is applied onto the entire upper surface of the wafer 51, when the polyimide 76 on the emitter electrode 58 of the effective chip 71 is removed (see (a) of FIG. 14), the polyimide 76 on the dicing line 73 which partitions the effective chips 71 is also removed and the insulating film 57a on the dicing line 73 is exposed (see (c) of FIG. 14). On the other hand, the insulating film 57a is covered with the polyimide 76 on the dicing line 73 which partitions the ineffective chips 72 (see (b) of FIG. 14).

The effective chip 71 means an available chip when chips are arranged at the center of the wafer 51. The ineffective chip 72 means a chip which is arranged in the outer circumference of the wafer 51 and is not available as an element since the edge thereof is chipped off or since a necessary process, such as deposition, is not completely performed.

(5) The collector electrode 62, which is a rear electrode, is formed on the rear surface of the wafer 51 by sputtering.

(6) A nickel film 58b and a gold film 58c are formed only on the aluminum electrode 58a on the surface surrounded by the end 76b of the polyimide 76 by electroless plating to form the emitter electrode 58 (see (c) of FIG. 14). This is needed in order to solder the emitter electrode 58 to an external lead conductor. As illustrated in (c) of FIG. 14, the polyimide on the dicing line 73 is also removed. However, since the insulating film 57a is exposed, the nickel film 58b and the gold film 58c are not deposited by electroless plating.

(7) The wafer 51 is diced into chips along the dicing lines 73 by a blade 82 (see FIG. 17).

Next, the reason why the outer circumferential portion of the wafer 51 and a portion other than the effective chips 71 are covered with the polyimide 76 in the above-mentioned process will be described. FIG. 15 is a diagram illustrating the structure of the wafer subjected to edge rinse and FIG. 16 is a diagram illustrating the structure of the wafer on which polyimide is not formed. In FIG. 15, (a) is a plan view illustrating a main portion and (b) is a cross-sectional view illustrating the main portion taken along the line X-X of (a). In FIG. 15, reference numeral 55a indicates an oxide film that is formed at the same time as the gate oxide film 55 is formed, reference numeral 56a indicates a polyimide film that is formed at the same time as the gate electrode 56 is formed, reference numeral 57a indicates an insulating film that is formed at the same time as the interlayer insulating film 57 is formed, and reference numeral 58d indicates an aluminum film that is formed at the same time as the aluminum electrode 58a is formed.

(Reason 1) As illustrated in FIG. 15, edge rinse 90 is performed on the outer circumferential portion of the wafer 51 and, for example, silicon forming the wafer 51, a polysilicon film for forming the gate electrode 56, and a BPSG film, which is the interlayer insulating film 57 are exposed from the outer circumferential portion of the wafer 51. The edge rinse 90 is a process of removing a photoresist which covers the outer circumferential portion of the wafer 51.

As such, when various films formed on the wafer 51 are exposed from the outer circumferential portion by the edge rinse 90, plating metal is abnormally deposited on a conductive film, such as the polysilicon film 56a or the aluminum film 58d in the plating process. When an abnormal deposit 91 peels off and is attached to the surface of a semiconductor chip (hereinafter, simply referred to as a chip) during the plating process or in the subsequent process, the reliability of the manufactured semiconductor device, such as an FS-IGBT, is reduced. In order to prevent the reduction in the reliability, the outer circumferential portion of the wafer 51 is covered with the polyimide 76 such that the outer circumferential portion of the wafer 51 is not plated.

(Reason 2) As illustrated in FIG. 16, when the entire surface of the wafer 51 is not covered with the polyimide 76, the aluminum electrode 58a of the ineffective chip 72 is plated with plating metal 92 (for example, a nickel film or a metal film). As a result, the region to be plated increases and the chemical life of a plating solution is reduced, which results in an increase in manufacturing costs. In order to solve the problems, a portion other than the effective chip 71 is covered with the polyimide 76. However, the insulating film 57a covers the breakdown voltage structure 70 and the dicing line 73.

Patent Document 1 (identified further on) discloses a technique which forms a passivation film made of a resist on the main surface of a wafer in which a plurality of chips are formed so as to be separated from each other by dicing lines, removes the passivation film on the dicing lines while leaving the passivation film in a region that is several millimeters away from the outer circumferential portion of the wafer, attaches a protective tape to the main surface of the wafer, and grinds the rear surface of the water. In this way, the gap between the dicing line and the protective tape is closed until it reaches the outer circumferential portion of the wafer and the infiltration of abrasive water is prevented when the rear surface of the wafer is ground. Therefore, it is possible to prevent a pad portion of the chip from being contaminated due to Si scrap caused by the mixture of the abrasive water.

CITATION LIST

Patent Document

Patent Document 1: JP 2007-36129 A

However, in the above-mentioned technique according to the related art, when the wafer is diced along the dicing lines 73 by the blade 82, abnormal stress is applied to the wafer 51 in the vicinity of a step portion at the end 76b of the polyimide 76 and the crack 83 is likely to occur in the rear surface of the wafer 51 to which the dicing tape 81 is attached (see FIG. 17). FIG. 17 is a diagram illustrating an aspect in which a crack occurs due to polyimide during dicing. In FIG. 17, (a) is a plan view illustrating a main portion and (b) is a cross-sectional view illustrating the main portion taken along the dicing line 73. Although not illustrated in FIG. 17, the insulating film 57a is formed on the dicing line 73 on the front surface of the wafer 51 and the collector electrode 62, which is a rear electrode, is formed on the rear surface. The crack 83 extends to a portion A of the effective chip 71 and causes the deterioration of the characteristics of the effective chip 71 or a reduction in the reliability of the effective chip 71.

Furthermore, Patent Document 1 discloses a structure in which the outer circumferential portion of the wafer is surrounded by a resist film such that an abrasive solution is not infiltrated into the surface of the wafer when the wafer is thinned. However, Patent Document 1 does not disclose a measure in which a plating film is formed on the front electrode (aluminum electrode) of an element such that a crack caused by polyimide does not occur in the rear surface of the effective chip during dicing. Therefore, the structure disclosed in Patent Document 1 cannot prevent the occurrence of a crack due to polyimide.

SUMMARY

In order to solve the above-mentioned problems of the related art, an object of the invention is to provide a method of manufacturing a semiconductor device which can prevent the occurrence of a crack due to polyimide when a wafer is diced along dicing lines by a blade and the abnormal deposition of plating metal in an outer circumferential portion of the wafer and can increase the chemical life of a plating solution to reduce manufacturing costs.

In order to solve the above-mentioned problems and achieve the object of the invention, a method of manufacturing a semiconductor device according to the invention includes: forming ineffective chips in a circumference of a first main surface of a semiconductor wafer; forming effective chips in a region surrounded by the ineffective chips; forming a front electrode on the effective chips and the ineffective chips; providing an insulating film on dicing lines which partition the effective chips and the ineffective chips; forming a rear electrode on a second main surface of the semiconductor wafer; forming polyimide on an outer circumferential portion of the first main surface of the semiconductor wafer with a predetermined width from an outer circumferential end of the semiconductor wafer such that the polyimide continuously covers the ineffective chips from the outer circumferential end of the semiconductor wafer to the inside and continuously covers a portion which is a predetermined distance away from the outer circumferential end of the semiconductor wafer to the effective chip in the dicing line interposed between the ineffective chips; forming a metal film on the front electrode formed on the effective chips using plating; and cutting the semiconductor wafer into semiconductor chips along the dicing lines using a blade.

Another method of manufacturing a semiconductor device according to the invention includes: forming ineffective chips in a circumference of a first main surface of a semiconductor wafer; forming effective chips in a region surrounded by the ineffective chips; forming a front electrode on the effective chips and the ineffective chips; providing an insulating film on dicing lines which partition the effective chips and the ineffective chips; forming a rear electrode on a second main surface of the semiconductor wafer; forming polyimide on an outer circumferential portion of the first main surface of the semiconductor wafer with a predetermined width from an outer circumferential end of the semiconductor wafer; and forming a metal film on the front electrode formed on the effective chips using plating. In the forming of the polyimide, the polyimide is formed so as to continuously cover the ineffective chip from the outer circumferential end of the semiconductor wafer to the inside. For the dicing line, an initial cutting direction, a direction intersecting the initial cutting direction, and a cutting end side of the initial cutting direction are predetermined. In addition, the polyimide is formed so as to continuously cover a portion which is a predetermined distance away from the outer circumferential end of the semiconductor wafer to the effective chip in the dicing line interposed between the ineffective chips on the cutting end side of the dicing line in the initial cutting direction. The semiconductor wafer is cut into semiconductor chips along the dicing lines in the initial cutting direction by the blade.

Still another method of manufacturing a semiconductor device according to the invention includes: forming ineffective chips in a circumference of a first main surface of a semiconductor wafer; forming effective chips in a region surrounded by the ineffective chips; forming a front electrode on the effective chips; forming an insulating film on the ineffective chips; forming the insulating film so as to extend on dicing lines which partition the effective chips and the ineffective chips; forming a rear electrode on a second main surface of the semiconductor wafer; forming polyimide on an outer circumferential portion of the first main surface of the semiconductor wafer with a predetermined width from an outer circumferential end of the semiconductor wafer such that the polyimide continuously covers a portion which is a predetermined distance away from the outer circumferential end of the semiconductor wafer to the effective chip; forming a metal film on the front electrode formed on the effective chips using plating; and cutting the semiconductor wafer into semiconductor chips along the dicing lines using a blade.

In the method of manufacturing a semiconductor device according to the invention, the predetermined width of the polyimide from the outer circumferential end of the semiconductor wafer may be equal to or greater than 2 mm and equal to or less than 10 mm.

In the method of manufacturing a semiconductor device according to the invention, the predetermined width of the polyimide from the outer circumferential end of the semiconductor wafer may be equal to or greater than 5 mm and equal to or less than 10 mm.

In the method of manufacturing a semiconductor device according to the invention, the predetermined distance between the effective chip and the polyimide may be equal to or greater than 2 mm.

In the method of manufacturing a semiconductor device according to the invention, the front electrode may be an aluminum electrode. The insulating film may be an oxide film. The metal film may be a plating film obtained by forming a gold film on a nickel film. The plating may be electroless plating. The rear electrode may be a laminated film of an aluminum film, a nickel film, and a gold film.

DETAILED DESCRIPTION

Figure 1:
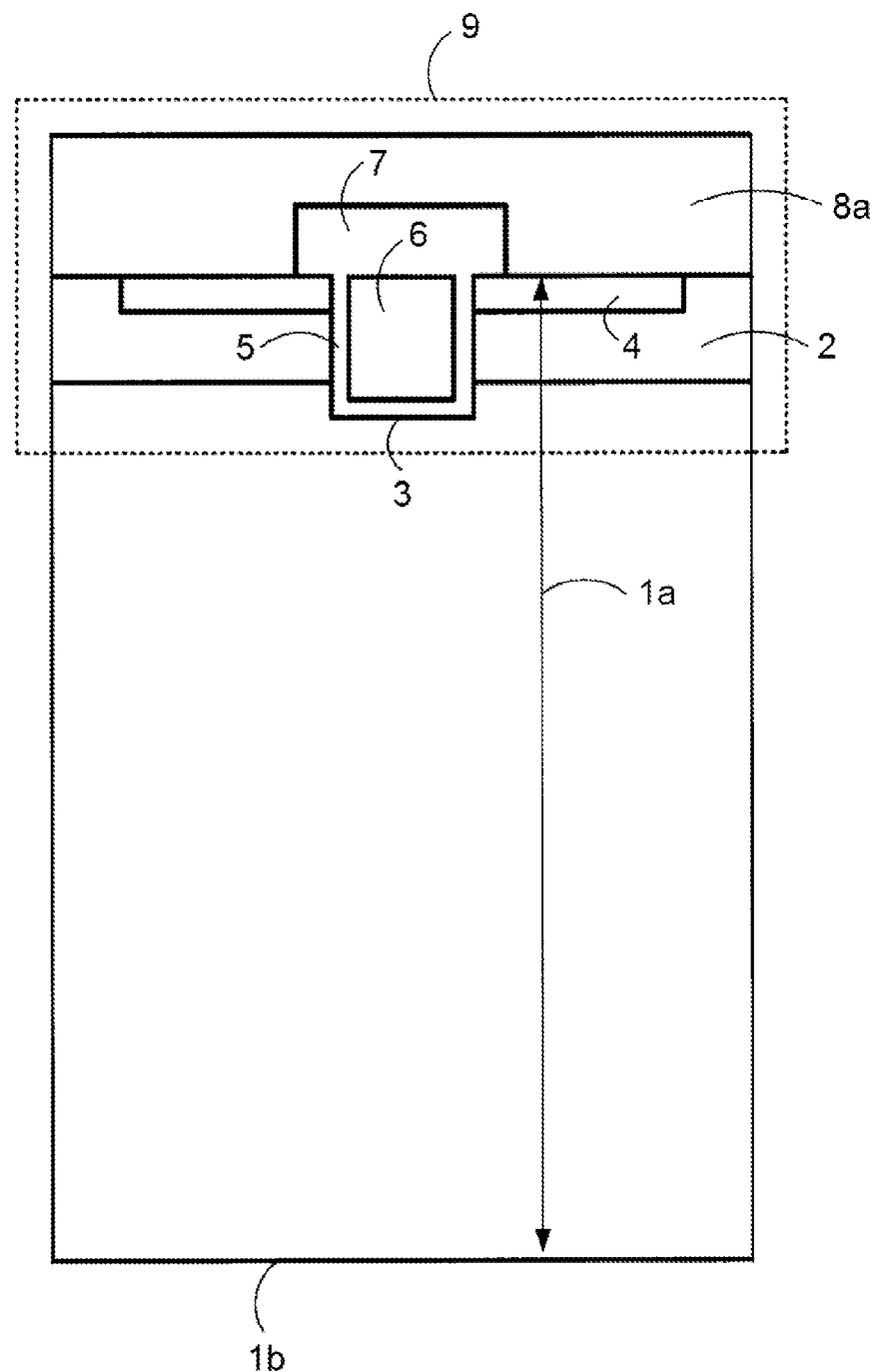
FIG. 1 is a diagram (part 1) illustrating a process of manufacturing a main portion of a semiconductor device according to a first embodiment of the invention.

Hereinafter, methods of manufacturing semiconductor devices according to exemplary embodiments of the invention will be described in detail with reference to the accompanying drawings. In the following description of the embodiments and the accompanying drawings, the same components are denoted by the same reference numerals and the description thereof will not be repeated.

First Embodiment

First, a method of manufacturing a semiconductor device according to a first embodiment of the invention will be described. FIG. 1, FIG. 2, FIG. 3, FIG. 4, FIG. 5, FIG. 6, and FIG. 7 are diagrams illustrating a process of manufacturing a main portion of the semiconductor device according to the first embodiment of the invention. FIG. 8 is a diagram illustrating the cross-section of the main portion (cell) of the semiconductor device according to the first embodiment of the invention. FIGS. 1 to 7 show the main portion of the semiconductor device manufactured by the semiconductor device manufacturing method according to the first embodiment of the invention in the order of processes. FIG. 8 shows an FS-IGBT as an example of the semiconductor device according to the first embodiment of the invention. The structure of the FS-IGBT is the same as that of the FS-IGBT illustrated in FIG. 14 and thus the detailed description thereof will not be repeated.

In FIGS. 1 to 8, reference numeral 1a indicates an n silicon substrate (wafer 1), reference numeral 2 indicates a p well layer, reference numeral 3 indicates a trench, reference numeral 4 indicates an n emitter layer, reference numeral 5 indicates a gate oxide film, reference numeral 6 indicates a gate electrode, reference numeral 7 indicates an interlayer insulating film, reference numeral 8 indicates an emitter electrode, reference numeral 8a indicates an aluminum electrode, reference numeral 8b indicates a nickel film, reference numeral 8c indicates a gold film, reference numeral 10 indicates an n-FS layer, reference numeral 11 indicates a p collector layer, and reference numeral 12 indicates a collector electrode. However, FIG. 8 does not show a gate pad. The emitter electrode 8 includes the aluminum electrode 8a, and the nickel film 8b and the gold film 8c that cover the aluminum electrode 8a. Next, a process of manufacturing the FS-IGBT illustrated in FIG. 8 will be described with reference to FIGS. 1 to 7.

(1) As illustrated in FIG. 1, a surface structure 9 including, for example, the p well layer 2, the n emitter layer 4, the gate electrode 6, and the aluminum electrode 8a (which is a front electrode and is a portion of the emitter electrode 8) is formed on the front surface of an n silicon substrate 1a (wafer 1). The interlayer insulating film 7 is formed between the gate electrode 6 and the aluminum electrode 8a. The aluminum electrode 8a may be made of an aluminum-silicon (Al—Si) film or an aluminum-silicon-copper (Al—Si—Cu) film other than an aluminum (Al) film.

Figure 2:
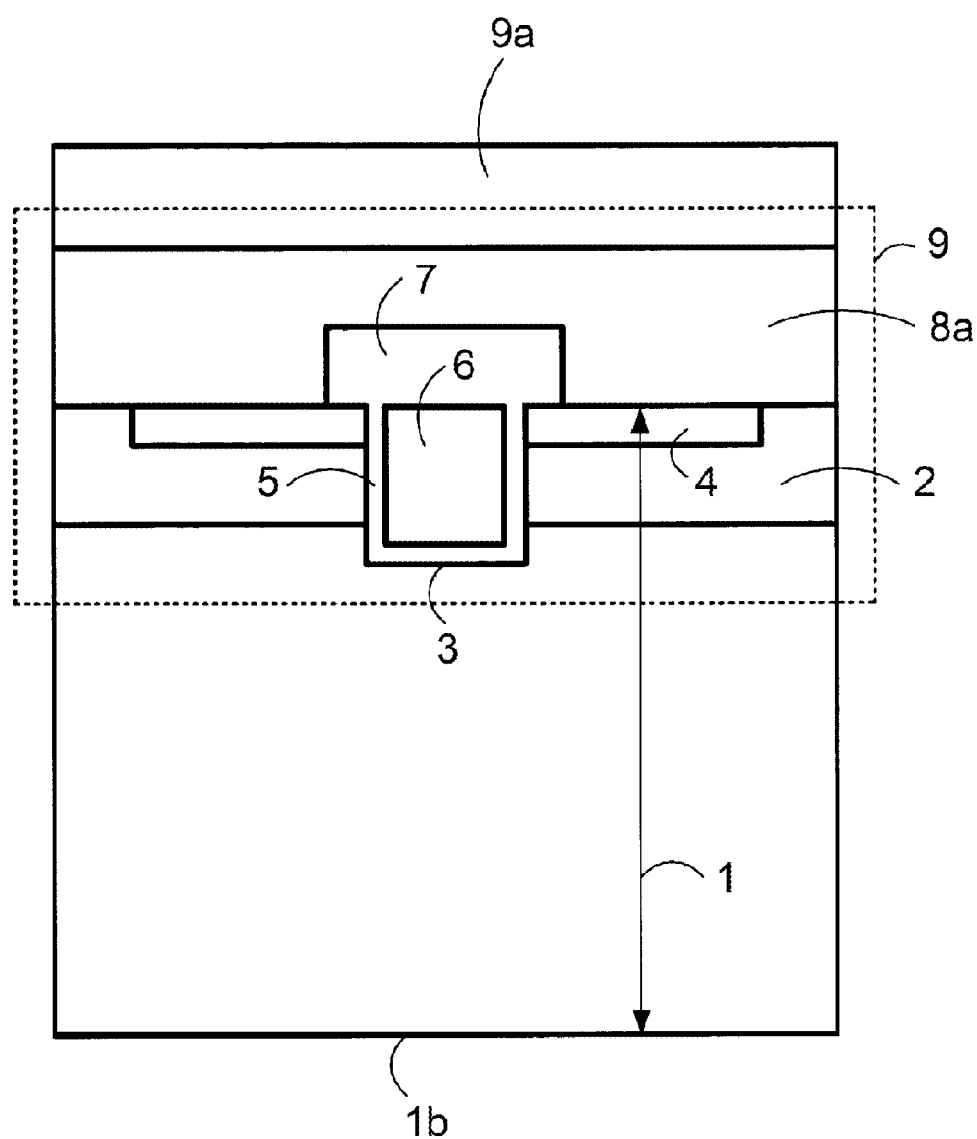
FIG. 2 is a diagram (part 2) illustrating the process of manufacturing the main portion of the semiconductor device according to the first embodiment of the invention.

(2) As illustrated in FIG. 2, a protective tape 9a is attached to the surface of the surface structure, a rear surface 1b is ground, and the protective tape 9a peels off. In addition, wet etching is performed on the ground surface. A thick wafer (n silicon substrate) 1a is changed into a thin wafer 1 with a thickness of, for example, about 150 μm by the wet etching. The thickness varies depending on the breakdown voltage of the FS-IGBT.

Figure 3:
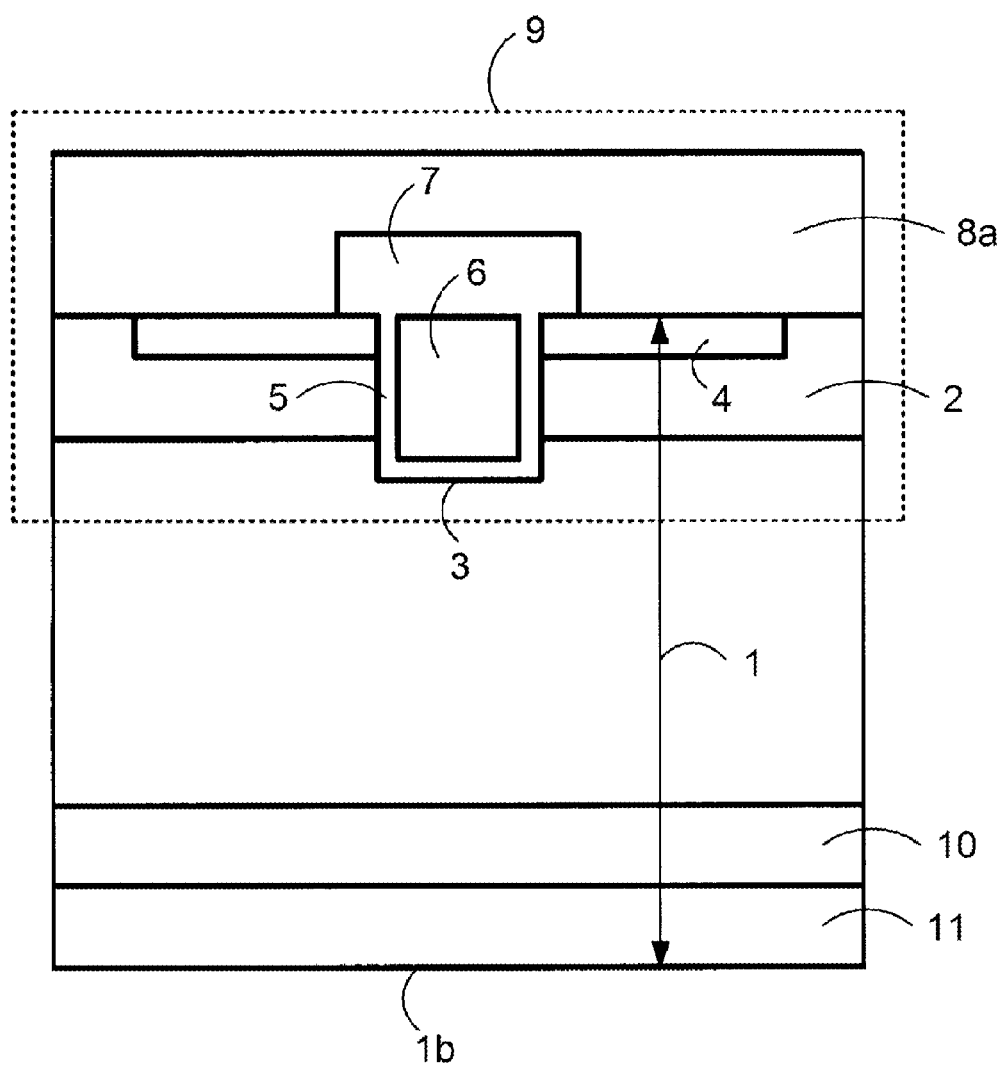
FIG. 3 is a diagram (part 3) illustrating the process of manufacturing the main portion of the semiconductor device according to the first embodiment of the invention.

(3) As illustrated in FIG. 3, phosphorous and boron ions are implanted into the rear surface 1b, and annealing is performed to form the n-FS layer 10 and the p collector layer 11.

Figure 4:
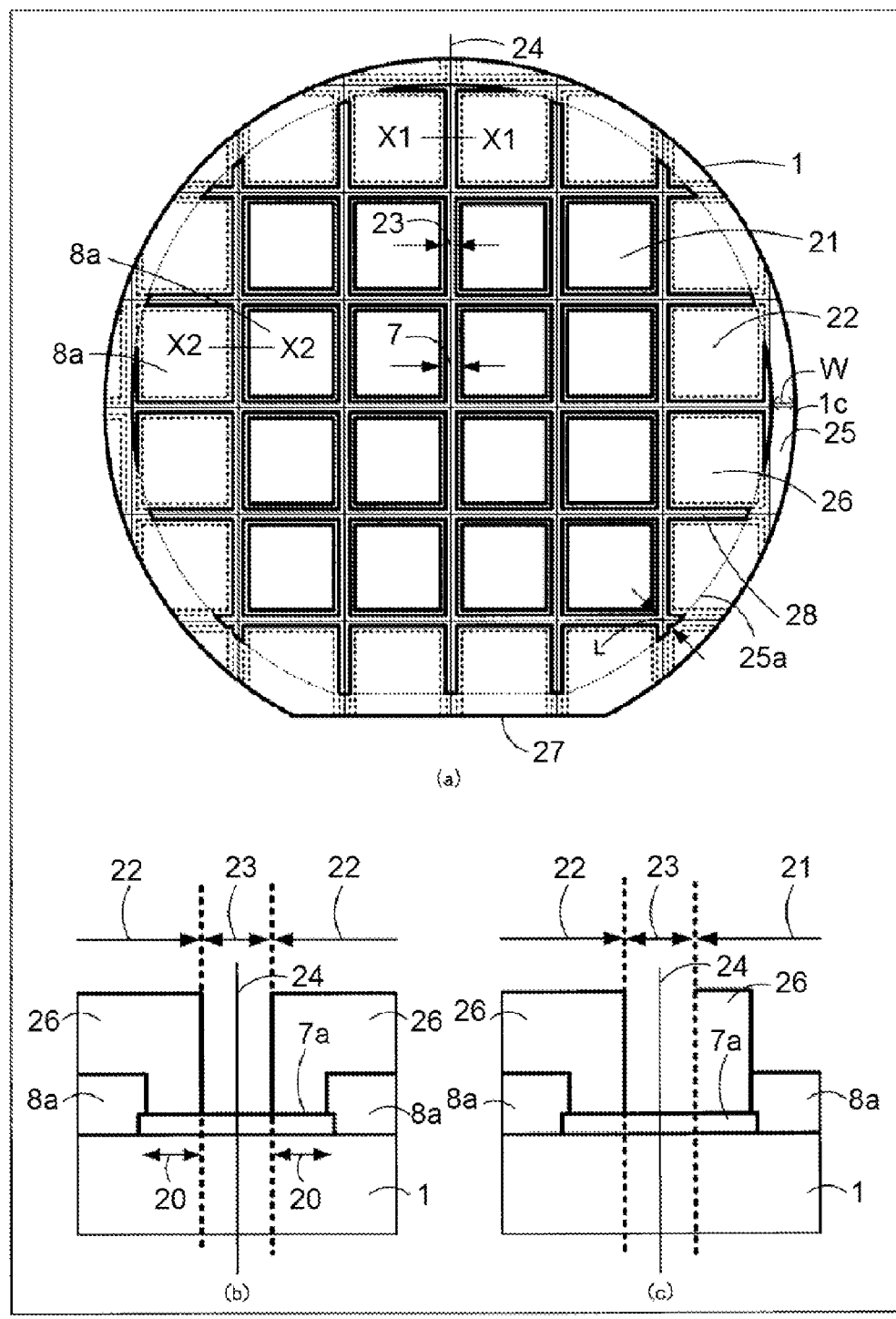
FIG. 4 is a diagram (part 4) illustrating the process of manufacturing the main portion of the semiconductor device according to the first embodiment of the invention.

(4) FIG. 4 shows the structure of a wafer made of polyimide according to this embodiment. In FIG. 4, (a) is a plan view illustrating a main portion, (b) is a cross-sectional view illustrating the main portion taken along the line X1-X1 of (a), and (c) is a cross-sectional view illustrating the main portion taken along the line X2-X2 of (a). As illustrated in FIG. 4, polyimide (polyimide in an outer circumferential portion is represented by reference numeral 25 and polyimide which is continuous with the polyimide in the outer circumferential portion and is arranged inside the polyimide is represented by reference numeral 26) is applied with a thickness of about 15 μm on the entire upper surface of the wafer 1. Then, the polyimide 26 which covers the aluminum electrode 8a of an effective chip 21 and the polyimide 26 on a dicing line 23 which is covered with the insulating film 7a are removed while the polyimide 25 in the outer circumferential portion of the wafer 1 and the polyimide 26 on an ineffective chip 22 remain. The insulating film 7a is, for example, a field oxide film or an insulating film which is formed at the same time as the interlayer insulating film 7 is formed.

In (b) of FIG. 4, in some cases, a breakdown voltage structure 20 (for example, a RESURF structure) of the effective chip 21 is covered with the insulating film 7a and the insulating film 7a is covered with the polyimide 26. However, as illustrated in FIG. 4, when the entire breakdown voltage structure 20 is covered with the insulating film 7a, only the emitter electrode 8a of the ineffective chip 22 may be covered, and the emitter electrode 8a and the insulating film 7a of the effective chip 21 may be exposed. Although not illustrated in the drawings, when a metal electrode, such as a guard ring, is exposed as the breakdown voltage structure 20, the breakdown voltage structure 20 is also covered with the polyimide 26 in order to prevent the deposition of a plating film on the metal electrode of the breakdown voltage structure 20 and protect the breakdown structure in the subsequent process.

The effective chip 21 means an available chip when chips are arranged at the center of the wafer 1. Specifically, a chip that is a distance L of 2 mm or more away from the end 25a of the polyimide 25 in the outer circumferential portion is the effective chip 21. The ineffective chip 22 means a chip which is arranged in the outer circumference of the wafer 1 and is not available as an element since the edge thereof is chipped off or since a necessary process, such as deposition, is not completely performed.

A portion in which the polyimide 26 on the dicing line 23 is removed extends to the dicing line 23 interposed between the ineffective chips 22 (reference numeral 28 indicates the extending portion). The insulating film 7a is exposed from the removed portion. The insulating film 7a is, for example, a BPSG (boron phosphorous glass).

The width W of the polyimide 25 which is formed in the outer circumferential portion of the wafer 1 from the end 1c of the wafer is equal to or greater than 2 mm. When the width W is less than 2 mm, silicon or polysilicon is exposed by edge rinse and a plating film is likely to be abnormally deposited on the silicon or polysilicon, as described in the related art. When the width W is equal to or greater than 5 mm, polysilicon or silicon exposed by edge rinse is reliably coated, which is preferable. When the width W is too large, the number of effective chips 21 is reduced. Therefore, the width W may be equal to or less than about 10 mm at most.

In some cases, the crack (see reference numeral 33 in FIG. 9) which occurs during dicing extends to the rear surface of the effective chip 21, which has an adverse effect on the semiconductor device. Therefore, the minimum distance W between the effective chip 21 and the polyimide 25 in the outer circumferential portion is equal to or greater than 2 mm. When the distance W is less than 2 mm, the crack 33 which occurs in the dicing line 23 is likely to reach the effective chip 21. The width of the dicing line 23 is, for example, about 80 μm. The crack which occurs in the rear surface of the effective chip 21 will be described below (see FIG. 9). In FIG. 4, reference numeral 24 indicates the center line of the dicing line 23 and reference numeral 27 indicates an orientation flat (OF).

Figure 5:
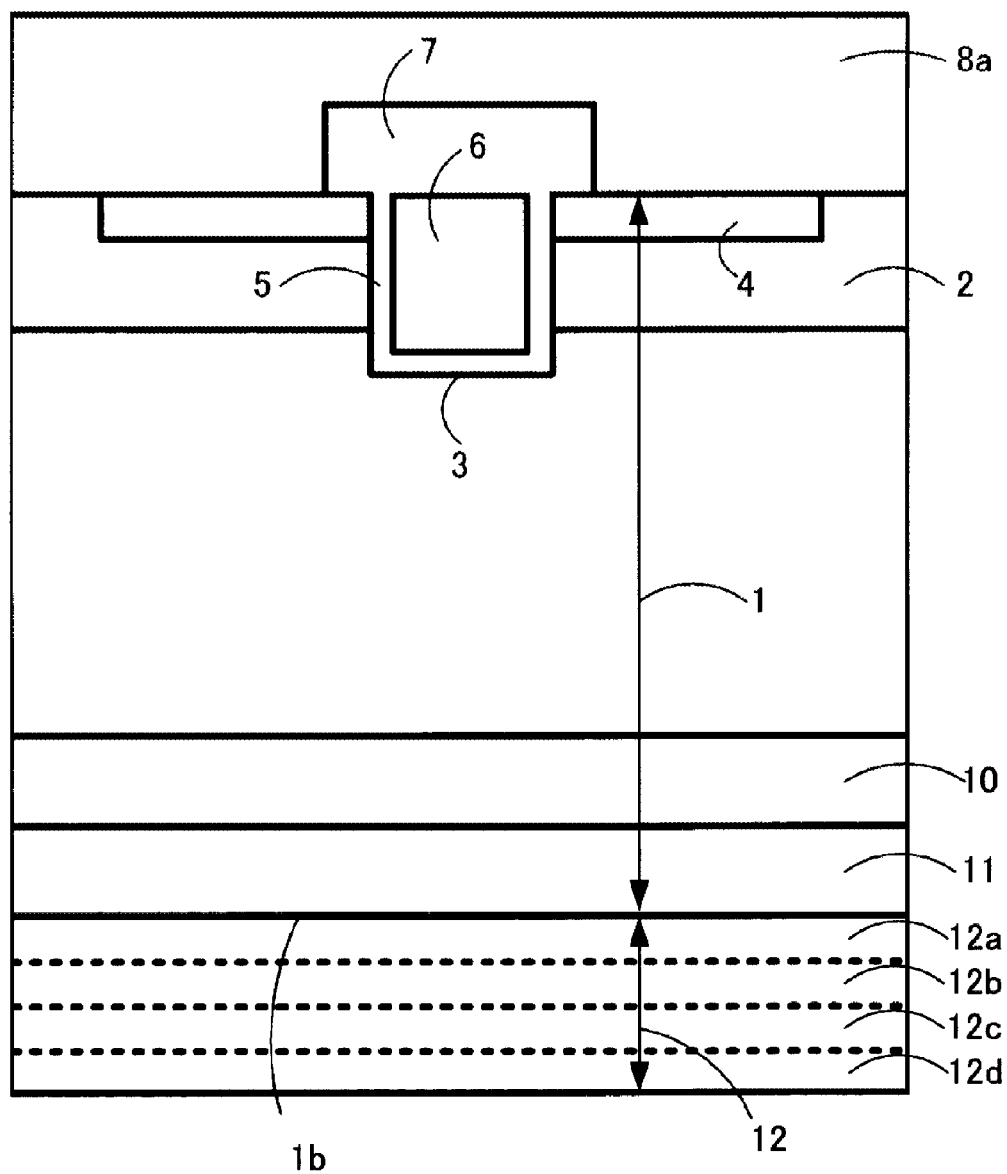
FIG. 5 is a diagram (part 5) illustrating the process of manufacturing the main portion of the semiconductor device according to the first embodiment of the invention.

(5) As illustrated in FIG. 5, a rear electrode (collector electrode 12) is formed on the rear surface 1b of the wafer 1 by sputtering. The collector electrode 12 is a laminated film of an aluminum film 12a (or an aluminum-silicon film)/a titanium film 12b/a nickel film 12c/a gold film 12d from the surface of the wafer 1.

Figure 6:
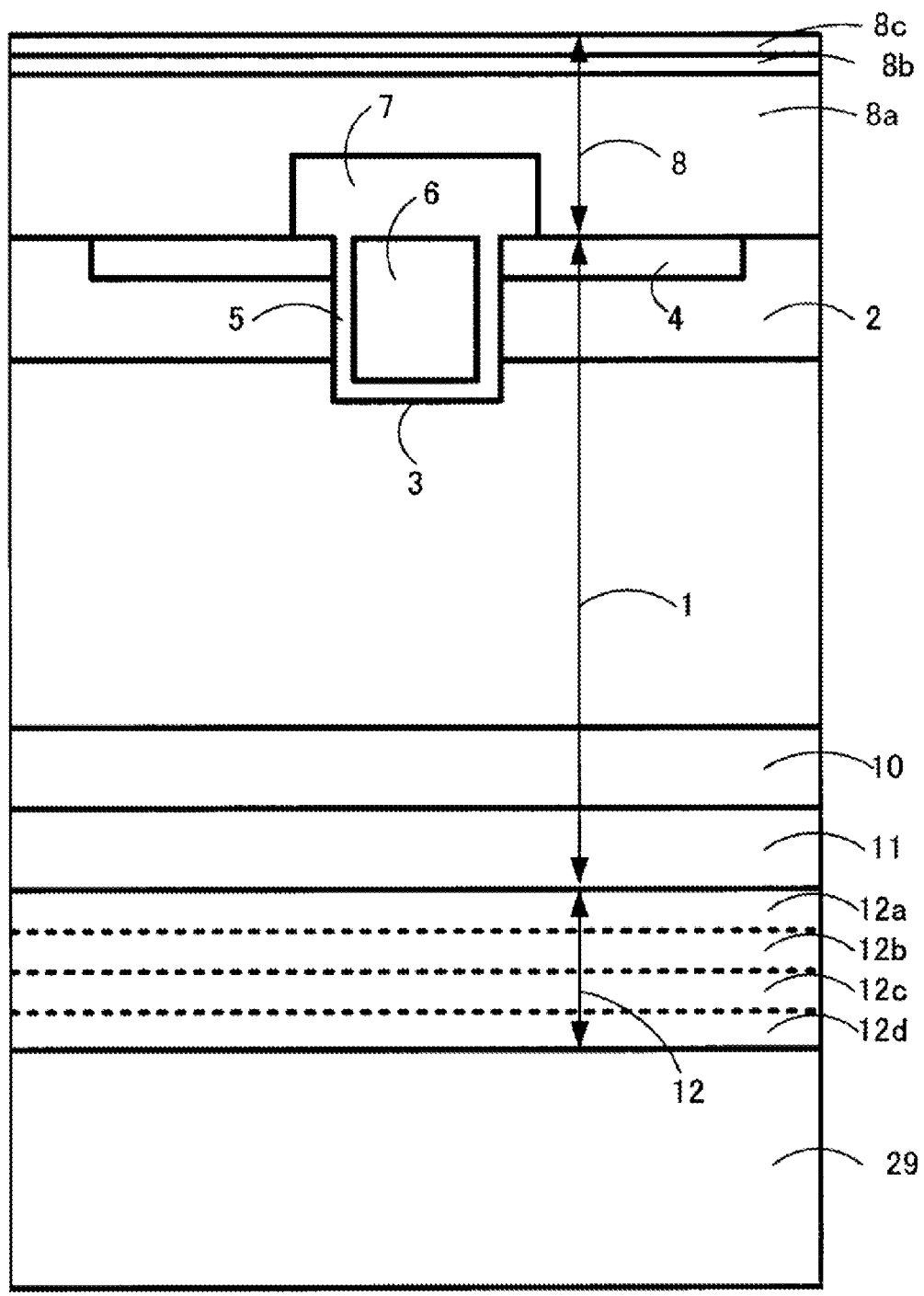
FIG. 6 is a diagram (part 6) illustrating the process of manufacturing the main portion of the semiconductor device according to the first embodiment of the invention.

(6) As illustrated in FIG. 6, the collector electrode 12 on the rear surface 1b of the wafer 1 is attached to a glass plate 29. The entire laminate is put into an electroless plating layer and the nickel film 8b and the gold film 8c are sequentially formed on the aluminum electrode 8a of the surface of the wafer by electroless plating to form the emitter electrode 8. The nickel film 8b and the gold film 8c are formed on the surface of the aluminum electrode 8a since they are needed for soldering to an external lead conductor (external lead wire).

In some cases, process (4) is performed before process (2). In this case, the processes are performed in the order of (1), (4), (2), (3), (5), and (6). In addition, in some cases, process (1) of forming the aluminum electrode 8a is performed after process (3).

Figure 7:
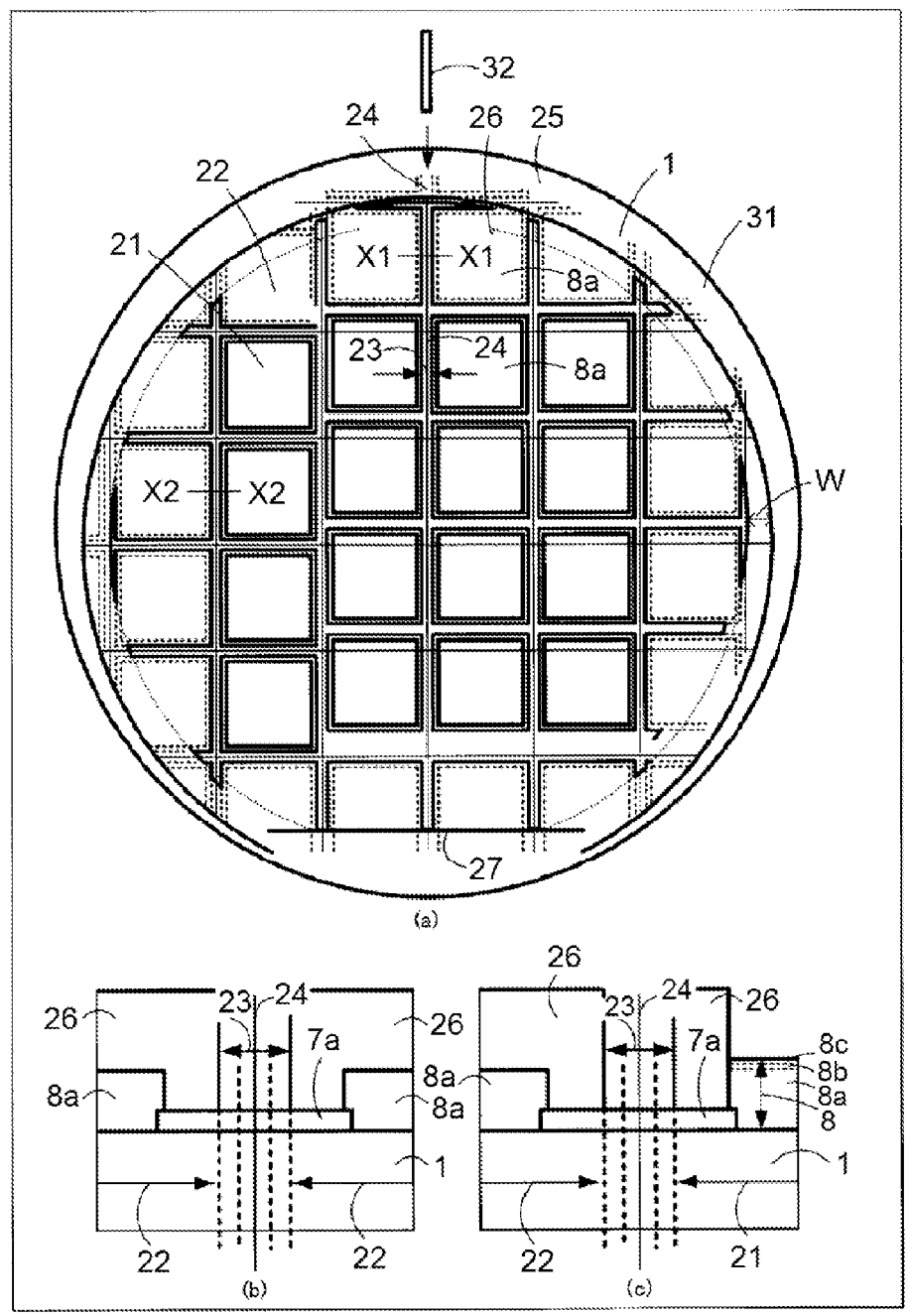
FIG. 7 is a diagram (part 7) illustrating the process of manufacturing the main portion of the semiconductor device according to the first embodiment of the invention.
Figure 8:
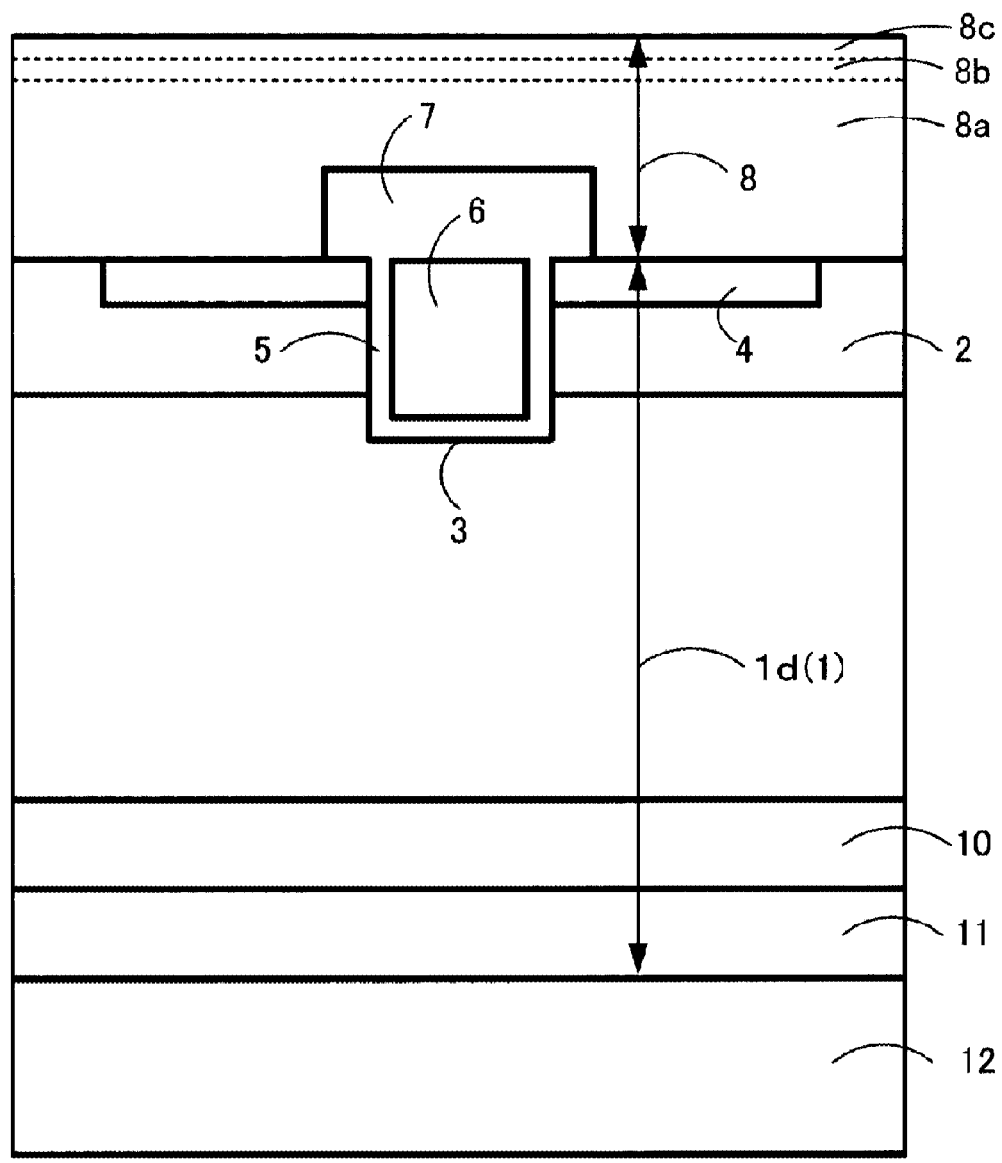
FIG. 8 is a diagram illustrating the cross-section of the main portion (cell) of the semiconductor device according to the first embodiment of the invention.

(7) As illustrated in FIG. 7, the wafer 1 is diced (cut) into chips along the center line 24 of the dicing line 23 by a blade 32 (diamond cutter) with a diameter of, for example, about 50 mm. When the wafer is diced along the dicing line 23 by the edge of the blade 32, a cutting width (dicing width) is, for example, about 40 μm. FIG. 7 shows an aspect in which the wafer 1 is diced in a direction indicated by an arrow from the upper side of FIG. 7 to the OF 27. In FIG. 7, reference numeral 31 indicates a dicing tape for attaching the wafer 1.

As illustrated in FIG. 4, the polyimide 26 on a portion from the dicing line 23 to a dicing line (a portion represented by reference numeral 28) interposed between the ineffective chips 22 is removed to prevent a crack (see reference numeral 33 in FIG. 9) from occurring in the rear surface of the effective chip 21 as much as possible. When the occurrence of the crack 33 is prevented, the occurrence of chipping (silicon pieces peel off and are chipped off from the wafer 1 due to the concentration of the crack 33) is also prevented.

Since polyimide is coated on the aluminum electrode 8a of the ineffective chip 22, the aluminum electrode 8a is not plated. Therefore, the plated region (plating deposition area) is narrowed and it is possible to increase the chemical life of an electroless plating solution. As a result, it is possible to reduce manufacturing costs.

Since the outer circumferential portion of the wafer 1 is covered with the polyimide 25, silicon or polysilicon which is exposed by edge rinse is covered with the polyimide 25. As a result, abnormal plating deposition in the outer circumferential portion of the wafer 1 is prevented. In addition, since the outer circumferential portion of the wafer 1 is covered with the polyimide 25, the occurrence of the crack 33 is prevented. Therefore, the strength of the chip is improved and it is possible to improve the reliability of products.

Figure 14:
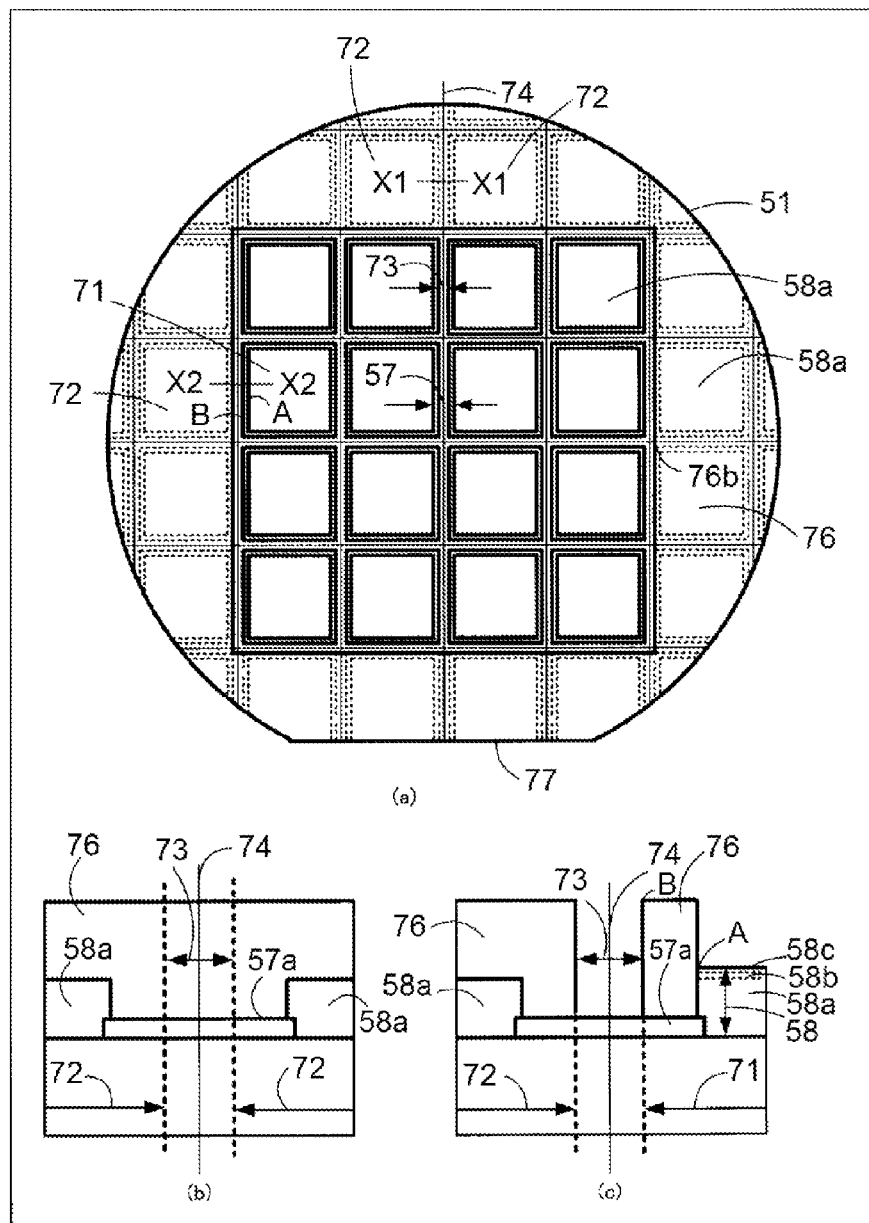
FIG. 14 is a diagram illustrating a wafer according to the related art.
Figure 15:
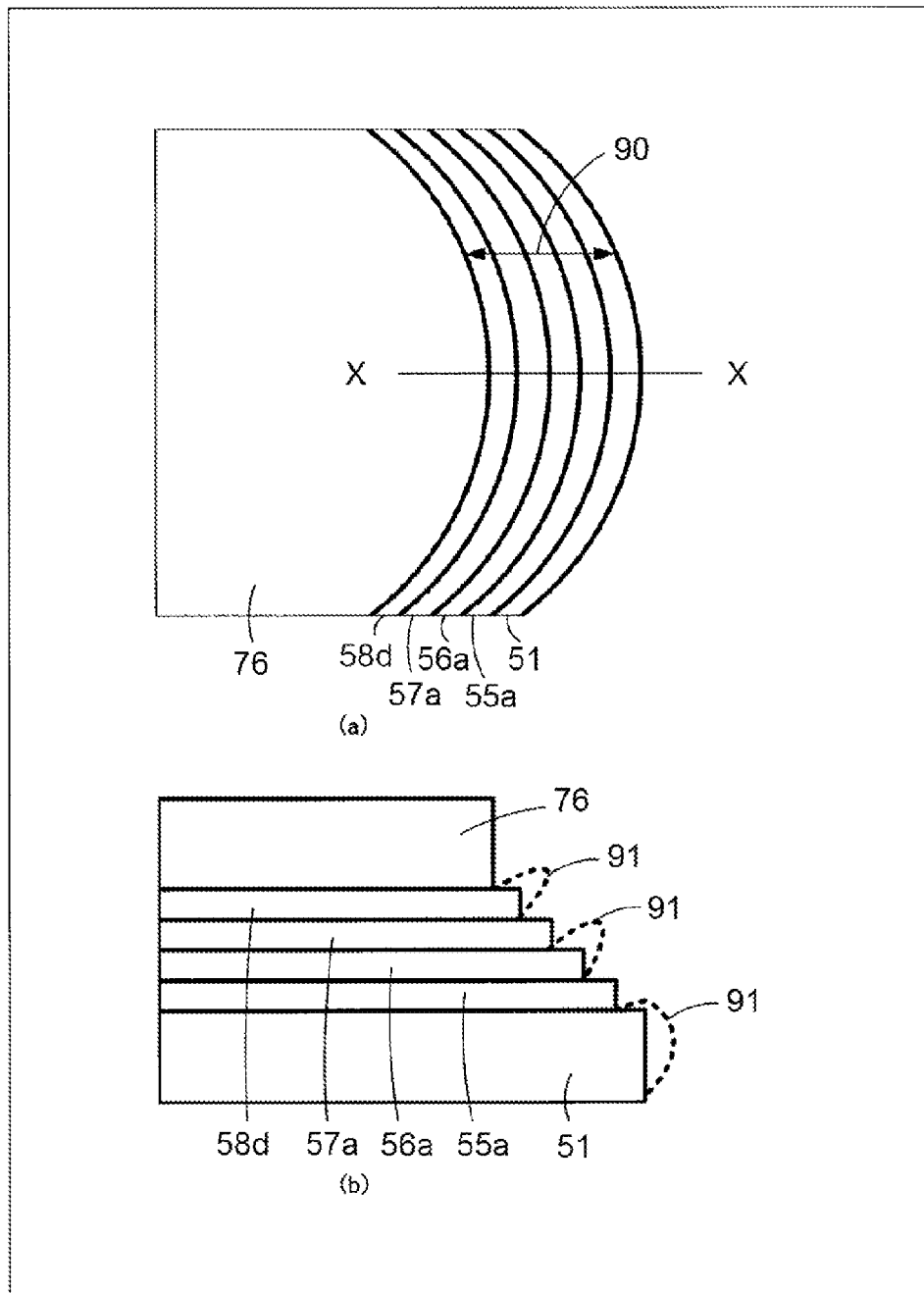
FIG. 15 is a diagram illustrating the structure of the wafer subjected to edge rinse.
Figure 16:
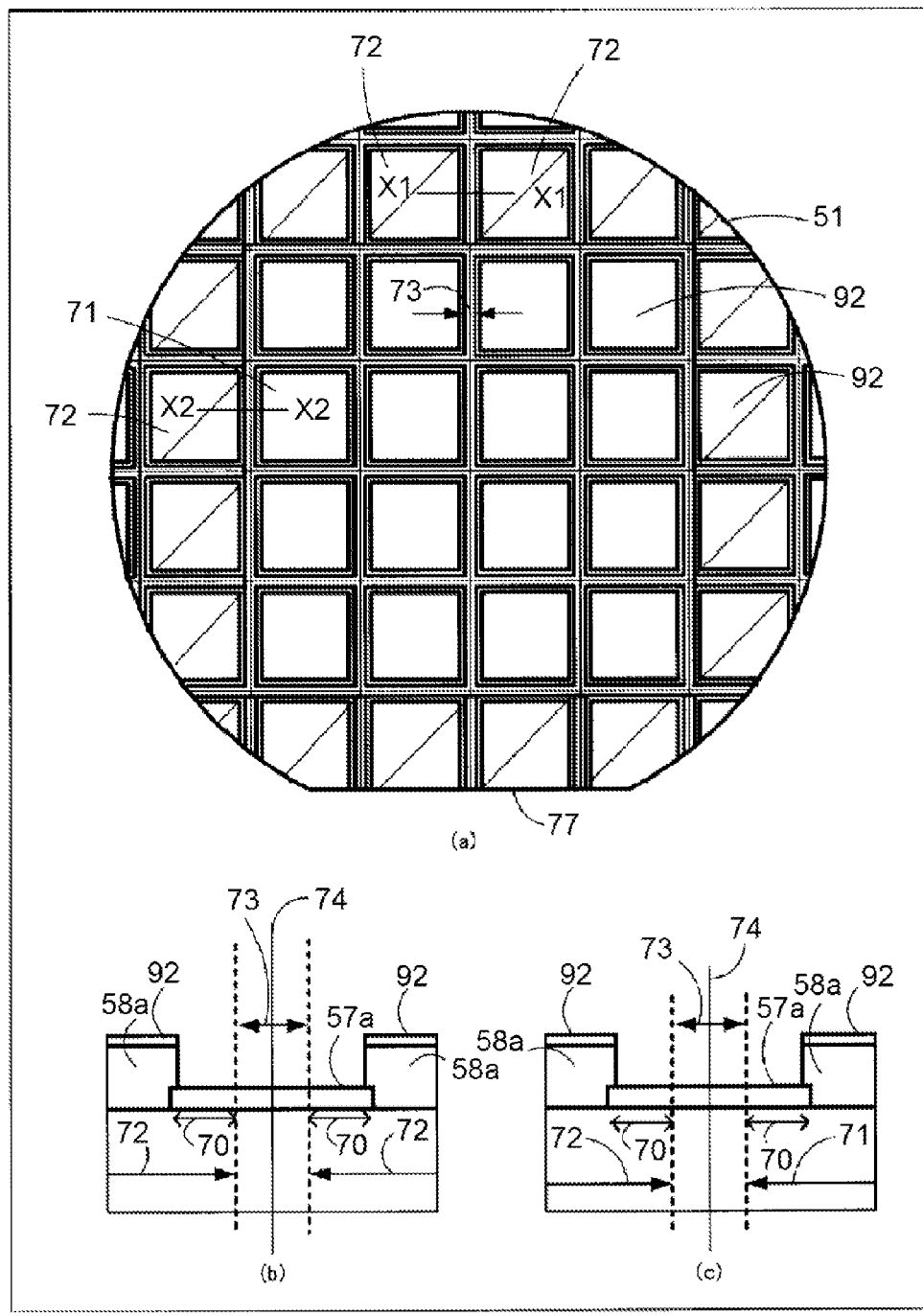
FIG. 16 is a diagram illustrating the structure of a wafer on which polyimide is not formed.
Figure 17:
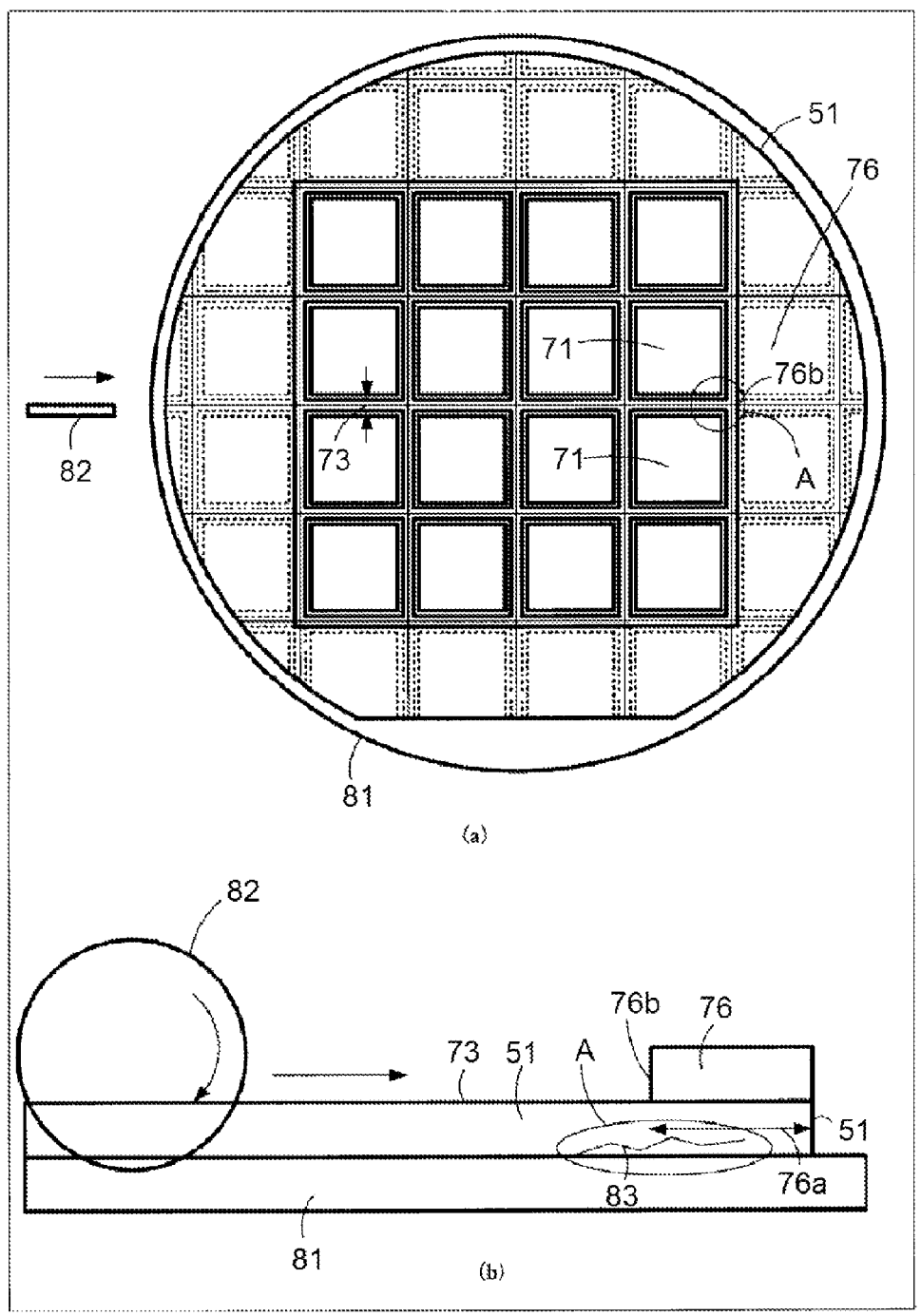
FIG. 17 is a diagram illustrating an aspect in which a crack occurs due to polyimide during dicing.

Next, the detailed investigation result of the state of the crack 33 which occurs in the rear surface of the wafer 1 when the wafer 1 is diced in the polyimide pattern illustrated in FIG. 14 according to the related art will be described. For the pattern of the polyimide 26, the polyimide 26 on the dicing line 23 interposed between the ineffective chips 22 is also covered. Therefore, in FIG. 9, reference numeral 26b corresponds to reference numeral 76b in FIG. 14.

Figure 9:
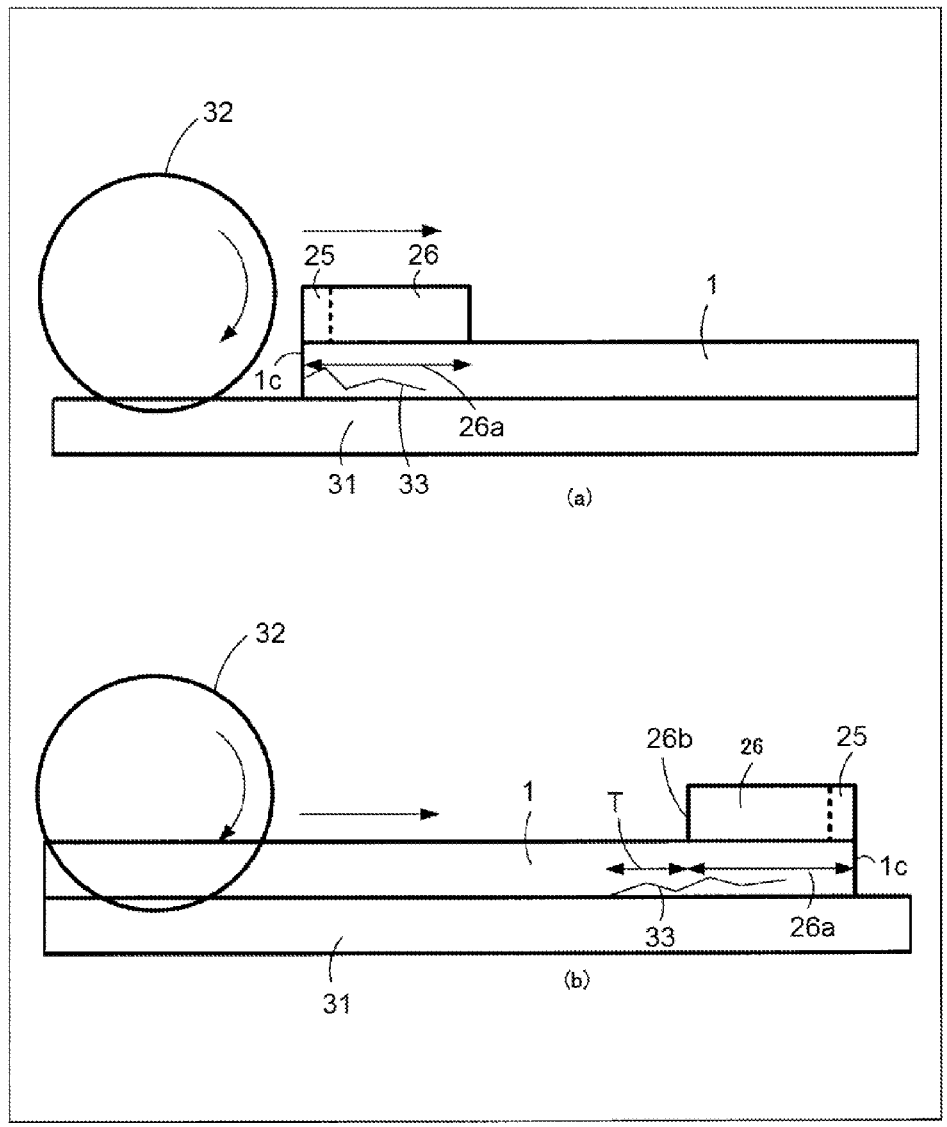
FIG. 9 is a diagram (part 1) illustrating the state of a crack which occurs in a rear surface of a wafer.

FIG. 9 is a diagram (part 1) illustrating the state of the crack 33 which occurs in the rear surface of the wafer 1. FIG. 9 shows a state in which dicing is performed first along the dicing lines 23 when no dicing has been performed along the horizontal and vertical dicing lines 23. In FIG. 9, (a) is a diagram illustrating a case in which the blade 32 is inserted from the end 1c of the wafer (cutting starts) and (b) is a diagram illustrating a case in which the blade 32 is separated from the end 1c of the wafer (cutting ends). The dicing line 23 interposed between the ineffective chips 22 is covered with the polyimide 25 and the polyimide 26. In addition, the width W of the polyimide 25 in the outer circumferential portion is 2 mm. The emitter electrode 8 or the collector electrode 12 is formed on the wafer 1, but the description thereof will be omitted for simplicity of explanation.

As illustrated in (a) of FIG. 9, the crack 33 starts from the end 1c of the wafer and ends in a portion 26a which is disposed immediately below the polyimide. In addition, as illustrated in (b) of FIG. 9, the crack 33 starts from a portion (polyimide end 26b) before the portion 26a which is disposed immediately below the polyimide and ends in the portion 26a which is disposed immediately below the polyimide. The distance T from the end 26b of the polyimide is less than 2 mm and is generally about 1 mm.

In (a) of FIG. 9, since the crack 33 occurs in the portion 26a which is disposed immediately below the polyimide, the crack 33 does not extend to the effective chip 21. On the other hand, as illustrated in (b) of FIG. 9, when the crack 33 starts before the portion 26a which is disposed immediately below the polyimide and the crack 33 approaches the polyimide 26 on the dicing line 23, the crack 33 is likely to extend to the rear surface of the effective chip 21.

Figure 10:
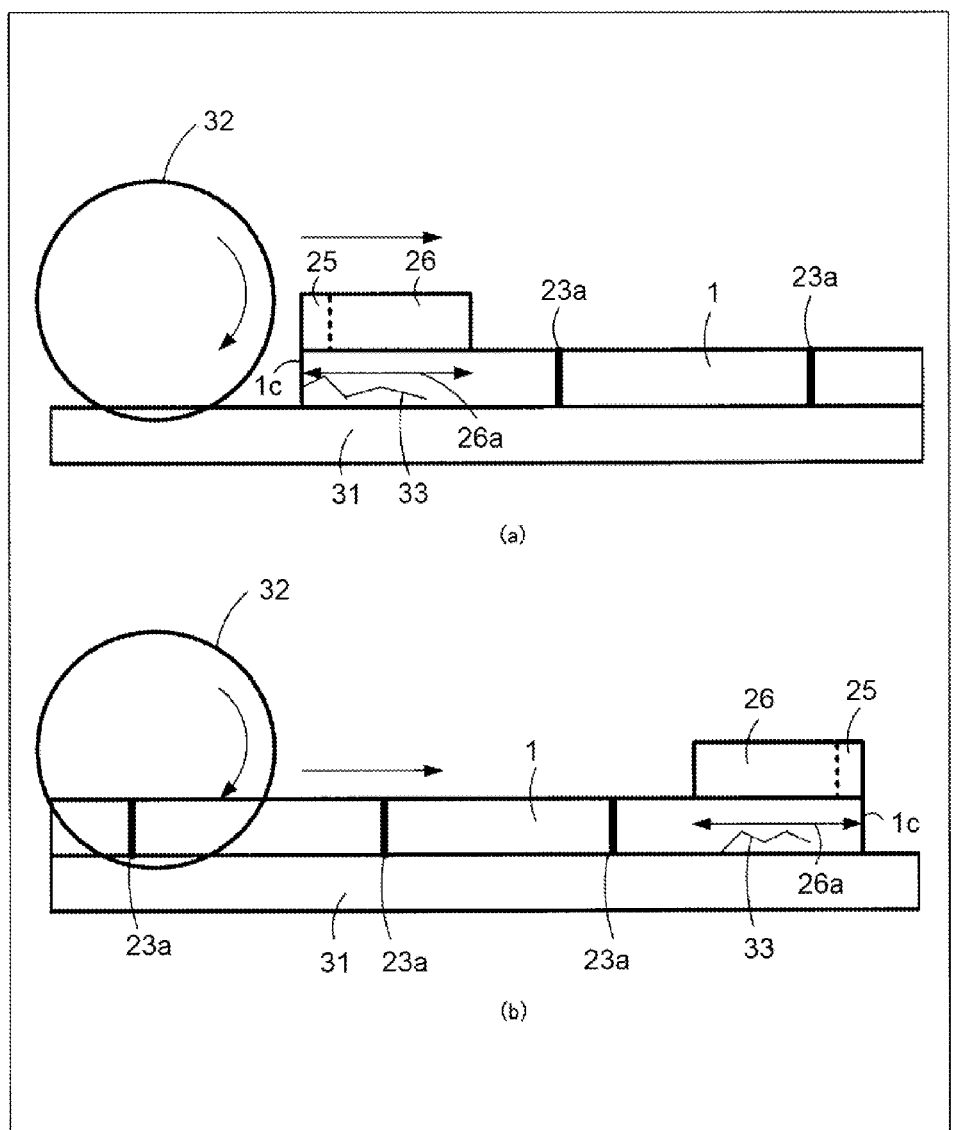
FIG. 10 is a diagram (part 2) illustrating the state of the crack which occurs in the rear surface of the wafer.

FIG. 10 is a diagram (part 2) illustrating the state of the crack 33 which occurs in the rear surface of the wafer 1. FIG. 10 illustrates the state of the crack 33 which occurs in the rear surface of the wafer 1 when the wafer is cut (diced) by the blade 32 along one of the horizontal and vertical dicing lines 23 and is then cut (diced) along the other dicing lines 23 which have not been cut and are perpendicular to the cut dicing lines 23a (the cut dicing line is represented by 23a). In FIG. 10, (a) is a diagram illustrating a case in which the blade 32 is inserted from the end 1c of the wafer (cutting starts) and (b) is a diagram illustrating a case in which the blade 32 is separated from the end 1c of the wafer (cutting ends).

As illustrated in (a) of FIG. 10, the crack 33 starts from the end 1c of the wafer and ends in a portion 26a which is disposed immediately below the polyimide. In addition, as illustrated in (b) of FIG. 10, the crack 33 starts and ends in the portion 26a which is disposed immediately below the polyimide. In FIG. 10, in both cases, the crack 33 occurs in the portion 26a which is disposed immediately below the polyimide and does not reach the effective chip 21. Therefore, the crack 33 has no adverse effect on the effective chip 21.

As can be seen from the above, a position which is away from the portion 26a disposed immediately below the polyimide and where the crack 33 occurs is a position where the blade 32 is separated from the wafer 1 on the dicing line 23 into which the blade 32 is inserted first. An example in which the occurrence of the crack 33 is prevented will be described in a second embodiment on the basis of the above.

Second Embodiment

Figure 11:
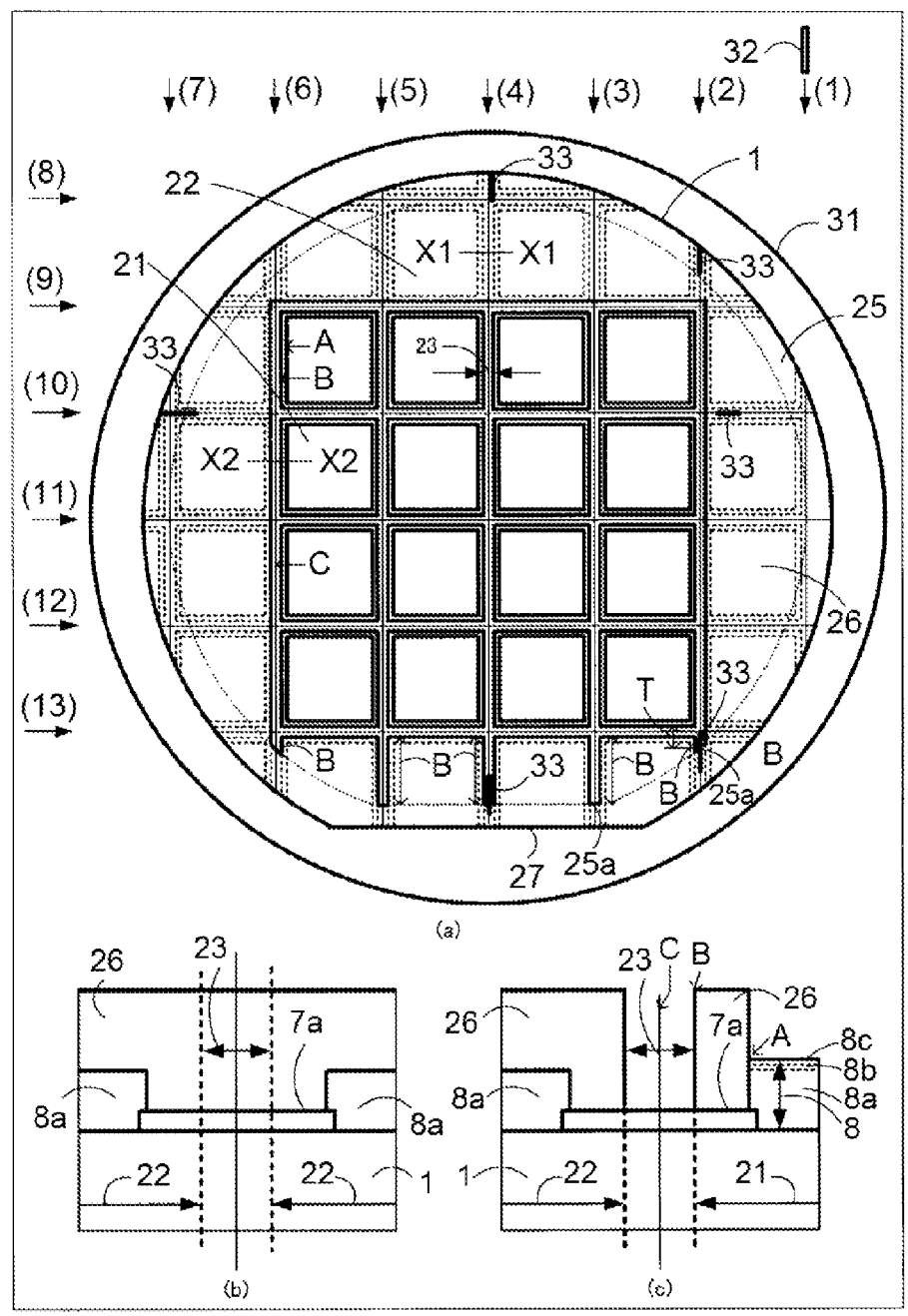
FIG. 11 is a main process diagram illustrating a method of manufacturing a main portion of a semiconductor device according to a second embodiment of the invention.

Next, a method of manufacturing a semiconductor device according to the second embodiment of the invention will be described. FIG. 11 is a main process diagram illustrating a method of manufacturing the semiconductor device according to the second embodiment of the invention. In FIG. 11, (a) is a plan view illustrating a main portion, (b) is a cross-sectional view illustrating the main portion taken along the line X1-X1 of (a), and (c) is a cross-sectional view illustrating the main portion taken along the line X2-X2 of (a).

The second embodiment differs from the first embodiment in that, in process (4) described above, the polyimide 26 on the dicing line 23 which is interposed between the ineffective chips 22 in the vicinity of the end of the dicing line 23 into which the blade 32 is inserted first is removed and the polyimide on the dicing lines 23 adjacent to the other ineffective chips 22 remains.

In FIG. 11, numbers (1) to (13) in parentheses indicate a dicing order and an arrow indicates a dicing direction. First, dicing is performed along first to seventh vertical dicing lines 23 ((1) to (7)). This direction is an initial dicing direction. Then, dicing is performed along eighth to thirteenth horizontal dicing lines 23 ((8) to (13)). In the first to seventh vertical dicing lines 23, the blade 32 is inserted into the upper end of the wafer 1 and the end point of the blade 32 is the OF 27 at the lower end of the wafer 1. The polyimide 25 on the dicing line 23 at the end point in the outer circumferential portion remains and the polyimide 26 arranged inside the polyimide 25 is removed (in FIG. 11, a region B).

Since the polyimide 26 is not formed on the dicing lines 23 (portion B) on the cutting end side of the blade 32 except for the polyimide 25 in the outer circumferential portion, the crack 33 occurs in the portion 26a which is disposed immediately below the polyimide in the outer circumference of the dicing line 23 interposed between the ineffective chips 22 and a portion which is at a distance T of about 1 mm (2 mm or less at most) from the polyimide end 25a.

Since the effective chip 21 is at a distance of 2 mm or more from the polyimide end 25a (distance L in FIG. 4), the crack 33 which occurs in the portion 26a disposed immediately below the polyimide in the outer circumferential portion does not reach the effective chip 21. Therefore, the crack 33 does not have an adverse effect on the effective chip 21.

The wafer is diced by the blade 32 along the eighth to thirteenth horizontal dicing lines 23 after the wafer is diced along the first to seventh vertical dicing lines 23a. At that time, the vertical dicing lines 23a which partition the effective chips 21 and the ineffective chips 22 have already been cut. Therefore, even when the crack 33 occurs in the portion 26a which is disposed immediately below the polyimide by dicing along the eighth to thirteenth horizontal dicing lines, it does not reach the effective chip 21 over the cut dicing lines. As a result, the crack does not have an adverse effect on the effective chip 21.

Therefore, a region in which no polyimide is formed, such as the region B illustrated in (a) of FIG. 11, may be not provided on the dicing line which is interposed between the ineffective chips on the cutting end side of the dicing line in a direction perpendicular to the initial cutting direction.

The second embodiment is an effective method when the position of a portion in which the blade 32 is inserted to dice the wafer 1 is determined or one of the horizontal and vertical dicing lines 23 (23*a*) to be diced first is determined.

In the above-described embodiment, the vertical direction (direction facing the orientation flat 27) is the initial cutting direction, but the cutting direction is not limited thereto. A vertical direction (direction in which cutting starts from the orientation flat 27) opposite to the cutting direction illustrated in FIG. 11 may be the initial cutting direction, or the horizontal direction (direction parallel to the orientation flat 27) may be the initial cutting direction. Alternatively, when the chips are arranged so as to be inclined with respect to the orientation flat 27, the order of the initial cutting direction and a cutting direction perpendicular to the initial cutting direction may be determined in advance.

As described above, when the initial cutting direction is determined in advance, for the dicing line arranged in the initial cutting direction, a portion, which is at a predetermined distance from the outer circumferential end of the semiconductor wafer with respect to the effective chip, in the dicing line interposed between the ineffective chips on the cutting end side is continuously covered. In other words, no polyimide is formed on the portion, which is at a predetermined distance from the effective chip, in the dicing line interposed between the ineffective chips on the cutting side. When the order of the cutting direction is not determined in advance, the method according to the first embodiment may be applied.

Third Embodiment

Figure 12:
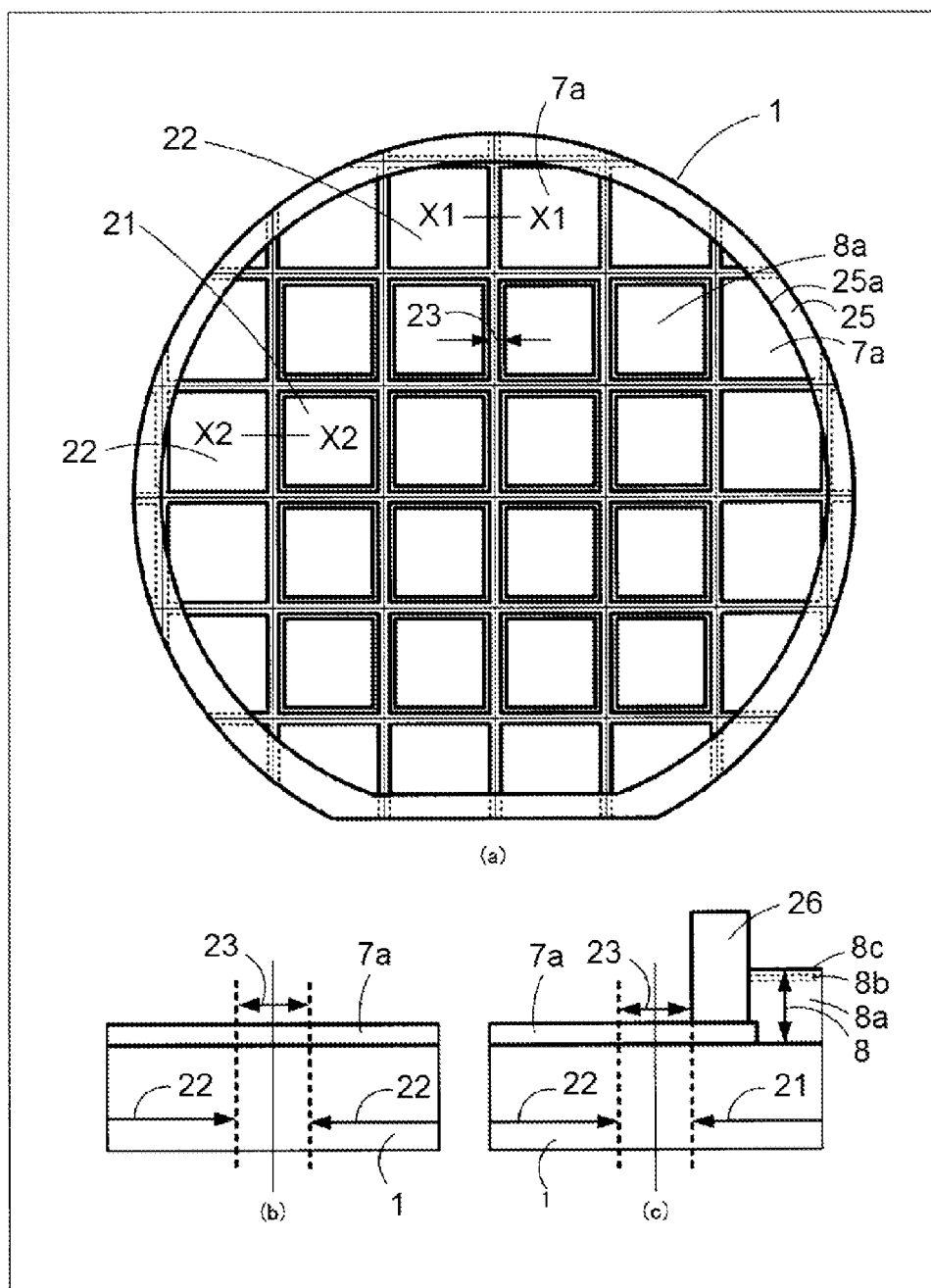
FIG. 12 is a main process diagram illustrating a method of manufacturing a main portion of a semiconductor device according to a third embodiment of the invention.
Figure 13:
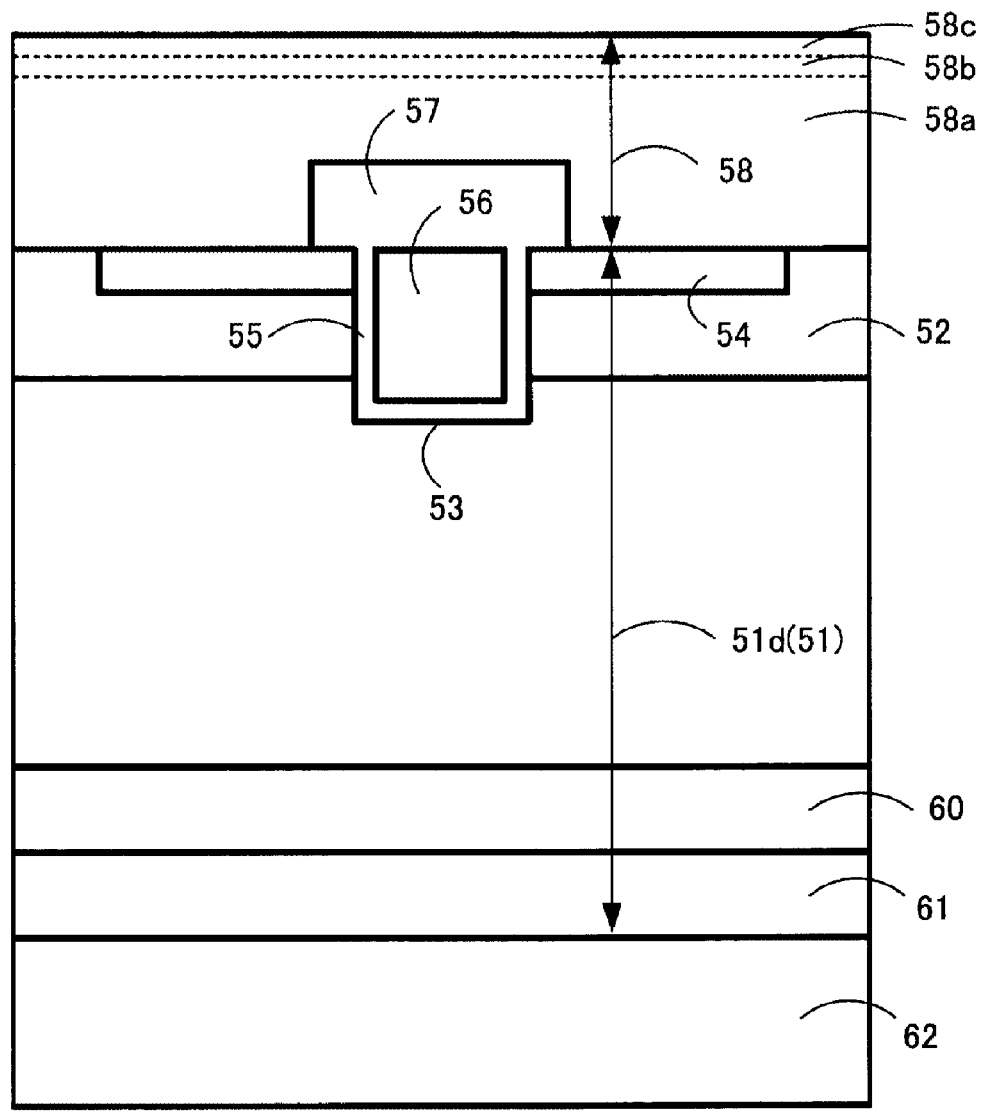
FIG. 13 is a diagram illustrating the cross-sectional structure of a main portion of an FS-IGBT.

Next, a method of manufacturing a semiconductor device according to a third embodiment of the invention will be described. FIG. 12 is a main process diagram illustrating the method of manufacturing the semiconductor device according to the third embodiment of the invention. In FIG. 12, (a) is a plan view illustrating a main portion, (b) is a cross-sectional view illustrating the main portion taken along the line X1-X1 of (a), and (c) is a cross-sectional view illustrating the main portion taken along the line X2-X2 of (a). The third embodiment differs from the first embodiment in that, in process (4) described above, the aluminum electrode 8*a* is not formed on the surface of the ineffective chip 22 and the surface of the ineffective chip 22 is covered with the insulating film 7*a* which extends from the dicing line 23.

According to the method of manufacturing the semiconductor device according to the third embodiment of the invention, in process (4) described above, only the outer circumferential portion of the wafer 1 is covered with the polyimide 25. Therefore, a crack 33 occurs in a portion 26*a* which is disposed immediately below the polyimide. However, even when the crack 33 extends inward from a polyimide end 25*a*, it reaches only a portion that is about 1 mm inside from the polyimide end 25*a*. Since the effective chip 21 is at a distance of 2 mm or more from the polyimide end 25*a*, the crack 33 does not reach the effective chip 21 and does not have an adverse effect on the effective chip 21.

Since the aluminum electrode 8*a* is not formed on the ineffective chip 22 and the insulating film 7*a* is formed on the ineffective chip 22, plating is not performed. Therefore, it is possible to increase the chemical life of an electroless plating solution and reduce manufacturing costs. In addition, since the outer circumferential portion of the wafer 1 is covered with the polyimide 25, abnormal deposition due to electroless plating does not occur.

In the above-described first to third embodiments, the method of manufacturing the semiconductor device according to the invention is applied to manufacture the FS-IGBT. However, the method of manufacturing the semiconductor device according to the invention is not limited to the manufacture of the FS-IGBT. The method of manufacturing the semiconductor device according to the invention may be applied to manufacture, for example, IGBTs other than the FS-IGBT, MOSFETs, and diodes.

As described above, according to the invention, the outer circumferential portion of the wafer and the ineffective chips are covered with polyimide and the polyimide on the dicing line interposed between the ineffective chips is removed. In this way, it is possible to prevent the occurrence of a crack in the rear surface of the effective chip due to dicing using the blade.

According to the invention, since the outer circumferential wall of the wafer is covered with polyimide, it is possible to prevent the occurrence of abnormal deposition in the outer circumferential portion of the wafer due to electroless plating.

According to the invention, since the ineffective chips are covered with polyimide, it is possible to prevent the ineffective chips from being plated. Therefore, it is possible to increase the chemical life of a plating solution and reduce manufacturing costs.

According to the invention, since the outer circumferential portion of the wafer is covered with polyimide and the entire upper surface of the ineffective chip is covered with an oxide film, it is possible to prevent the occurrence of a crack in the rear surface of the effective chip due to dicing using the blade and the occurrence of abnormal deposition in the outer circumferential wall of the wafer due to electroless plating. In addition, it is possible to increase the chemical life of a plating solution and reduce manufacturing costs.

INDUSTRIAL APPLICABILITY

As described above, the invention relates to a method of manufacturing a semiconductor device and is suitable for, particularly, a semiconductor device manufacturing method for manufacturing a semiconductor wafer (hereinafter, simply referred to as a wafer) using dicing with a blade.

EXPLANATIONS OF LETTERS OR NUMERALS

1 WAFER (THIN)
1*a* WAFER (THICK)
1*b* REAR SURFACE OF WAFER
1*c* END OF WAFER
2 p WELL LAYER
3 TRENCH
4 n EMITTER LAYER
5 GATE OXIDE FILM
6 GATE ELECTRODE
7 INTERLAYER INSULATING FILM
7*a* INSULATING FILM
8 EMITTER ELECTRODE
8*a* ALUMINUM ELECTRODE
8*b* NICKEL FILM

8c GOLD FILM
9 SURFACE STRUCTURE
10 n-FS LAYER
11 p COLLECTOR LAYER
12 COLLECTOR ELECTRODE
12a ALUMINUM FILM
12b TITANIUM FILM
12c NICKEL FILM
12d GOLD FILM
20 BREAKDOWN VOLTAGE STRUCTURE
21 EFFECTIVE CHIP
22 INEFFECTIVE CHIP
23 DICING LINE
24 CENTER LINE
25 POLYIMIDE (OUTER CIRCUMFERENTIAL PORTION)
25a END OF POLYIMIDE 25
26 POLYIMIDE (INSIDE)
26a PORTION DISPOSED IMMEDIATELY BELOW POLYIMIDE
26b END OF POLYIMIDE 26
27 ORIENTATION FLAT (OF)
28 EXTENDING PORTION
29 GLASS PLATE
31 DICING TAPE
32 BLADE
33 CRACK

The invention claimed is:

1. A method of manufacturing a semiconductor device comprising:
forming ineffective chips in a circumference of a first main surface of a semiconductor wafer;
forming effective chips in a region surrounded by the ineffective chips;
forming a front electrode on the effective chips and the ineffective chips;
providing an insulating film on dicing lines which partition the effective chips and the ineffective chips;
forming a rear electrode on a second main surface of the semiconductor wafer;
forming polyimide on an outer circumferential portion of the first main surface of the semiconductor wafer with a predetermined width from an outer circumferential end of the semiconductor wafer such that the polyimide continuously covers the ineffective chips from the outer circumferential end of the semiconductor wafer to the inside and continuously covers a portion which is a predetermined distance away from the outer circumferential end of the semiconductor wafer to the effective chip in the dicing line interposed between the ineffective chips;
forming a metal film on the front electrode formed on the effective chips using plating; and
cutting the semiconductor wafer into semiconductor chips along the dicing lines using a blade.

2. A method of manufacturing a semiconductor device comprising:
forming ineffective chips in a circumference of a first main surface of a semiconductor wafer;
forming effective chips in a region surrounded by the ineffective chips;
forming a front electrode on the effective chips and the ineffective chips;
providing an insulating film on dicing lines which partition the effective chips and the ineffective chips;
forming a rear electrode on a second main surface of the semiconductor wafer;
forming polyimide on an outer circumferential portion of the first main surface of the semiconductor wafer with a predetermined width from an outer circumferential end of the semiconductor wafer; and
forming a metal film on the front electrode formed on the effective chips using plating,
wherein, in the forming of the polyimide, the polyimide is formed so as to continuously cover the ineffective chip from the outer circumferential end of the semiconductor wafer to the inside,
for the dicing line, an initial cutting direction, a direction intersecting the initial cutting direction, and a cutting end side of the initial cutting direction are predetermined,
the polyimide is formed so as to continuously cover a portion which is a predetermined distance away from the outer circumferential end of the semiconductor wafer to the effective chip in the dicing line interposed between the ineffective chips on the cutting end side of the dicing line in the initial cutting direction, and
the semiconductor wafer is cut into semiconductor chips along the dicing lines in the initial cutting direction by the blade.

3. A method of manufacturing a semiconductor device comprising:
forming ineffective chips in a circumference of a first main surface of a semiconductor wafer;
forming effective chips in a region surrounded by the ineffective chips;
forming a front electrode on the effective chips;
forming an insulating film on the ineffective chips;
forming the insulating film so as to extend on dicing lines which partition the effective chips and the ineffective chips
forming a rear electrode on a second main surface of the semiconductor wafer;
forming polyimide on an outer circumferential portion of the first main surface of the semiconductor wafer with a predetermined width from an outer circumferential end of the semiconductor wafer such that the polyimide continuously covers a portion which is a predetermined distance away from the outer circumferential end of the semiconductor wafer to the effective chip;
forming a metal film on the front electrode formed on the effective chips using plating; and
cutting the semiconductor wafer into semiconductor chips along the dicing lines using a blade.

4. The method of manufacturing a semiconductor device according to claim 1,
wherein the predetermined width of the polyimide from the outer circumferential end of the semiconductor wafer is equal to or greater than 2 mm and equal to or less than 10 mm.

5. The method of manufacturing a semiconductor device according to claim 1,
wherein the predetermined width of the polyimide from the outer circumferential end of the semiconductor wafer is equal to or greater than 5 mm and equal to or less than 10 mm.

6. The method of manufacturing a semiconductor device according to claim 1,
wherein the predetermined distance between the effective chip and the polyimide is equal to or greater than 2 mm.

7. The method of manufacturing a semiconductor device according to claim 1,
wherein the front electrode is an aluminum electrode,
the insulating film is an oxide film, the metal film is a plating film obtained by forming a gold film on a nickel film, the plating is electroless plating, and the rear electrode is a laminated film of an aluminum film, a nickel film, and a gold film.

8. The method of manufacturing a semiconductor device according to claim 2, wherein the predetermined width of the polyimide from the outer circumferential end of the semiconductor wafer is equal to or greater than 2 mm and equal to or less than 10 mm.

9. The method of manufacturing a semiconductor device according to claim 3, wherein the predetermined width of the polyimide from the outer circumferential end of the semiconductor wafer is equal to or greater than 2 mm and equal to or less than 10 mm.

10. The method of manufacturing a semiconductor device according to claim 2, wherein the predetermined width of the polyimide from the outer circumferential end of the semiconductor wafer is equal to or greater than 5 mm and equal to or less than 10 mm.

11. The method of manufacturing a semiconductor device according to claim 3, wherein the predetermined width of the polyimide from the outer circumferential end of the semiconductor wafer is equal to or greater than 5 mm and equal to or less than 10 mm.

12. The method of manufacturing a semiconductor device according to claim 2, wherein the predetermined distance between the effective chip and the polyimide is equal to or greater than 2 mm.

13. The method of manufacturing a semiconductor device according to claim 3, wherein the predetermined distance between the effective chip and the polyimide is equal to or greater than 2 mm.

14. The method of manufacturing a semiconductor device according to claim 2, wherein the front electrode is an aluminum electrode, the insulating film is an oxide film, the metal film is a plating film obtained by forming a gold film on a nickel film, the plating is electroless plating, and the rear electrode is a laminated film of an aluminum film, a nickel film, and a gold film.

15. The method of manufacturing a semiconductor device according to claim 3, wherein the front electrode is an aluminum electrode, the insulating film is an oxide film, the metal film is a plating film obtained by forming a gold film on a nickel film, the plating is electroless plating, and the rear electrode is a laminated film of an aluminum film, a nickel film, and a gold film.

16. A method, comprising:

forming a semiconductor wafer including a plurality of chips and dicing lines to separate the plurality of chips from each other, the plurality of chips including incompletely-formed chips around an outer periphery of the semiconductor wafer, the incompletely-formed chips to be separated at the dicing lines from other chips of the plurality of chips inside the outer periphery; and forming a polyimide covering on the semiconductor wafer, wherein the polyimide covering includes an outer peripheral portion of polyimide on at least a portion of the incompletely-formed chips, the outer peripheral portion having a predetermined width defined by an inner edge and an outer edge, and an inner portion of polyimide extending a predetermined distance within the inner edge;

wherein the predetermined distance extends from the inner edge at least to a dicing line separating at least one incompletely-formed chip from at least one other chip.

17. The method of claim 16, wherein the predetermined width is between substantially 2 mm and substantially 10 mm.

18. The method of claim 16, wherein the predetermined distance is at least 2 mm.

19. The method of claim 16, further comprising separating the plurality of chips from each other along the dicing lines.

* * * * *